US012368193B2

(12) United States Patent
Van Tassell et al.

(10) Patent No.: US 12,368,193 B2
(45) Date of Patent: *Jul. 22, 2025

(54) ACOUSTIC SIGNAL BASED ANALYSIS OF BATTERIES

(71) Applicant: Liminal Insights, Inc., Emeryville, CA (US)

(72) Inventors: Barry J. Van Tassell, El Cerrito, CA (US); Shan Dou, Berkeley, CA (US); Shaurjo Biswas, El Cerrito, CA (US); Andrew G. Hsieh, Berkeley, CA (US); Andrew M. Raphael, El Cerrito, CA (US)

(73) Assignee: LIMINAL INSIGHTS, INC., Emeryville, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/544,579

(22) Filed: Dec. 19, 2023

(65) Prior Publication Data

US 2024/0413417 A1 Dec. 12, 2024

Related U.S. Application Data

(63) Continuation of application No. 17/112,756, filed on Dec. 4, 2020, now Pat. No. 11,855,265.

(Continued)

(51) Int. Cl.
*G01N 29/14* (2006.01)
*G01N 29/024* (2006.01)
(Continued)

(52) U.S. Cl.
CPC ........ *H01M 10/484* (2013.01); *G01N 29/024* (2013.01); *G01N 29/14* (2013.01); *G01R 31/392* (2019.01); *G08C 17/02* (2013.01)

(58) Field of Classification Search
CPC ............ G01N 29/041; G01N 29/0645; G01N 2291/02854; G01N 2291/0423; G01N 2291/263
See application file for complete search history.

(56) References Cited

U.S. PATENT DOCUMENTS 10,809,231 B2 * 10/2020 Hsieh .................. G01N 29/043
11,600,870 B2 * 3/2023 Dou ..................... G01N 29/032
(Continued)

OTHER PUBLICATIONS

Hu Xiaosong et al.: "State estimation for advanced battery management: Key challenges and future trend", Renewable and Sustainable Energy Reviews, Elseviers Science, New York, NY, US; vol. 114, Aug. 14, 2019; XP085804550.
(Continued)

*Primary Examiner* — Suman K Nath
(74) *Attorney, Agent, or Firm* — Polsinelli PC

(57) ABSTRACT

Systems and methods for acoustic signal based analysis, include obtaining acoustic response signal data of at least a portion of a battery cell, the acoustic response signal data comprising waveforms generated by transmitting one or more acoustic excitation signals into at least the portion of the battery cell and recording response vibration signals to the one or more acoustic excitation signals. One or more metrics are determined from at least the acoustic response signal data, the one or more metrics being determined based on correlation of the one or more metrics to one or more characteristics of battery cells and a reference model is generated from the one or more metrics. A test battery can be evaluated using the reference model. Actionable insights or recommendations can be generated based on the evaluation. The reference model can also be updated based on the evaluation.

20 Claims, 15 Drawing Sheets

Related U.S. Application Data

(60) Provisional application No. 62/943,507, filed on Dec. 4, 2019.

(51) Int. Cl.
*G01R 31/392* (2019.01)
*G08C 17/02* (2006.01)
*H01M 10/48* (2006.01)

(56) References Cited

U.S. PATENT DOCUMENTS

| | | |
|---|---|---|
| 2018/0120261 A1 | 5/2018 | Hsieh et al. |
| 2018/0164383 A1 | 6/2018 | Hsieh et al. |
| 2019/0072614 A1 | 3/2019 | Steingart et al. |
| 2020/0393811 A1 | 12/2020 | Sasaki et al. |
| 2022/0248148 A1 | 8/2022 | Verhulst et al. |

OTHER PUBLICATIONS

Extended European Search Report; dated Jun. 17, 2024; application # 21729788.6.

\* cited by examiner

Tx = Transmit (Pulse In)
Rx = Receive (Pulse Out)

ACOUSTIC SIGNAL BASED ANALYSIS OF BATTERIES

CROSS REFERENCE TO RELATED APPLICATIONS

This application is a continuation of and claims the benefit of U.S. application Ser. No. 17/112,756, filed on Dec. 4, 2020, entitled ACOUSTIC SIGNAL BASED ANALYSIS OF BATTERIES, which claims the benefit of priority to U.S. Provisional Application 62/943,507 filed on Dec. 4, 2019, entitled ACOUSTIC SIGNAL BASED ANALYSIS OF BATTERIES, All of which are expressly incorporated by reference herein in their entireties.

STATEMENT REGARDING FEDERALLY SPONSORED RESEARCH OR DEVELOPMENT

This subject of this disclosure was made with U.S. Federal government support under Grant No. AR0000866 awarded by the Department of Energy, Advanced Research Projects Agency. The U.S. Federal government has certain rights in the disclosure.

FIELD OF DISCLOSURE

Disclosed aspects are directed to inspection and diagnostics for electrochemical systems. More specifically, exemplary aspects are directed to acoustic signal based analysis of batteries.

BACKGROUND

Using acoustic signals to analyze structures can reveal valuable information in a non-invasive manner. For example, acoustic signal based techniques such as electrochemical-acoustic signal interrogation (EASI), acoustic resonance spectroscopy (ARS), resonant ultrasound spectroscopy (RUS), nonlinear acoustic resonance spectroscopy (NARS) or, nonlinear resonant ultrasound spectroscopy (NRUS), or other, can be used for determining physical, chemical, and electrochemical properties and states of electrochemical storage systems. For example, the acoustic signal based techniques can be used for determining properties such as state of charge, state of health, production quality, etc., for one or more battery cells or components thereof. The acoustic signal based techniques can be used to obtain information on such systems in any state of production or upon their deployment or use in the field.

Such acoustic signal based analyses can generate large quantities of data to be stored, transmitted, processed, and analyzed to derive information which may be desirable for various use cases. For example, when the acoustic signal based techniques are applied to inspect batteries over a long duration of time, large quantities of raw data may be generated for obtaining high-resolution waveforms. To analyze and extract meaningful information from such data outputs, the waveforms may be processed using digital signal processing techniques. In some examples, because of the nature of acoustic signal based measurements and the large variability in battery chemistry and geometry, making sense of such large volumes of data outputs in a meaningful way to yield actionable results on state of health and charge of batteries, or their production quality, using currently available techniques, is challenging if not impossible. Accordingly, there is a need for improved acoustic signal based analysis techniques, for example, in the field of battery system design, production, and use.

BRIEF DESCRIPTION OF THE DRAWINGS

The accompanying drawings are presented to aid in the description of various aspects of the present disclosure and are provided solely for illustration and not limitation.

SUMMARY

Figure 1A:
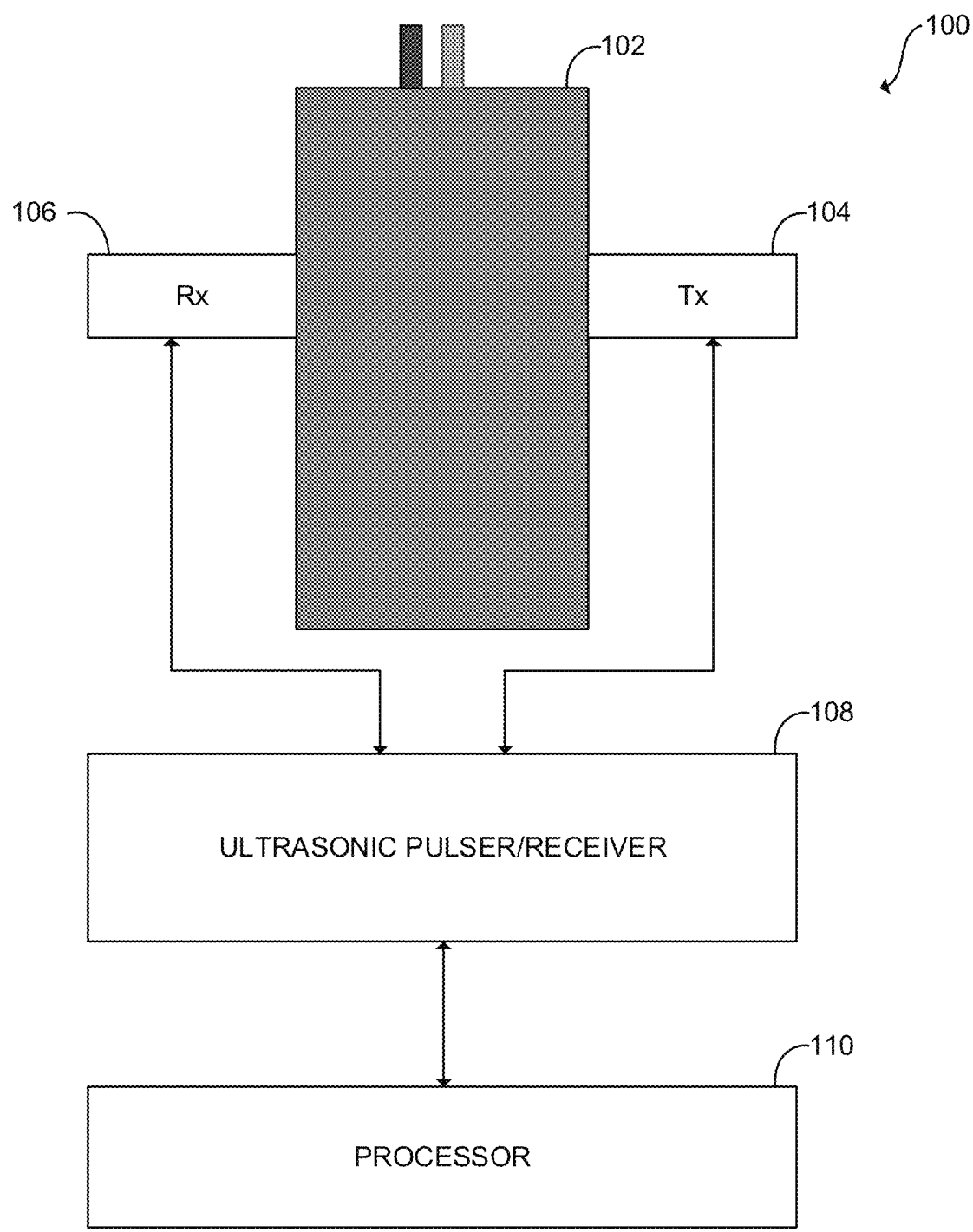
FIG. 1A-C illustrate example systems for analyzing a battery cell using acoustic signals, according to some aspects of the present disclosure.

One or more aspects of the present disclosure are directed to systems and techniques for analyzing acoustic response signal data of one or more batteries (and/or components thereof), determining one or more characteristics of the one or more batteries and generating one or more actionable insights in associated with the one or more batteries.

In one aspect, a method of acoustic signal based analysis includes obtaining acoustic response signal data of at least a portion of a battery cell, the acoustic response signal data including waveforms generated by transmitting one or more acoustic excitation signals into at least the portion of the battery cell and recording response vibration signals to the one or more acoustic excitation signals; evaluating the battery cell using at least one reference model to determine one or more characteristics of the battery cell, the reference model having been previously generated using previously collected acoustic response signal data and non-acoustic data of a plurality of batteries, the reference model receiving the acoustic response signal data of at least the portion of the battery cell as input; and generating one or more actionable insights for the battery cell using the one or more characteristics.

In another aspect, one or more characteristics include one or more performance characteristics, state of charge, state of health, construction quality, or expected lifecycle of the battery cell.

In another aspect, the method further includes updating the at least one reference model using the one or more characteristics and the one or more actionable insights.

In another aspect, generating the at least one reference model includes performing a signal processing on the previously collected acoustic response signal data of the plurality of batteries to yield processed signals; determining one or more metrics from the processed signal; and generate the at least one reference model using the one or more metrics.

In another aspect, the one or more metrics are determined by applying a machine learning technique to derive the one or more metrics from the previously collected acoustic response signal data.

In another aspect, determining the one or more metrics from at least the acoustic response signal data includes extracting a set of metrics which display a range of variation which is greater than a threshold.

In another aspect, the method further includes determining the threshold using a machine learning model.

In another aspect, the one or more metrics include one or more of electrolyte distribution through the battery cell, foreign object inclusions, electrode porosity, electrode density distribution, lithium plating after charging a battery cell, solid-electrolyte interphase layer quality, process drifts, ideal soaking time, protocol variations, battery cell quality, state of health, state of charge, voltage, resistance, impedance, capacity, cell capacity fade over lifetime.

In another aspect, the one or more metrics include one or more of a time-of-flight, centroid (mean) frequency, first break time, first peak, amplitude, or standard deviation of frequency obtained from the acoustic signal data, and electrochemical features including one or more of a voltage, a resistance, a current, and a capacity.

In another aspect, the one or more metrics are determined from one or more time-domain characteristics, one or more frequency-domain characteristics, or one or more time-frequency domain characteristics of the acoustic signal data.

In another aspect, the non-acoustic data includes electrochemical metrics.

In another aspect, the acoustic signal based analysis includes electrochemical-acoustic signal interrogation (EASI).

In another aspect, the acoustic signal based analysis includes one or more of acoustic resonance spectroscopy (ARS), resonant ultrasound spectroscopy (RUS), nonlinear acoustic resonance spectroscopy (NARS) or, nonlinear resonant ultrasound spectroscopy (NRUS).

In one aspect, an apparatus includes one or more memories having computer-readable instructions stored therein, and one or more processors. The one or more processors are configured to execute the computer-readable instructions to obtain acoustic response signal data of at least a portion of a battery cell, the acoustic response signal data including waveforms generated by transmitting one or more acoustic excitation signals into at least the portion of the battery cell and recording response vibration signals to the one or more acoustic excitation signals; evaluate the battery cell using at least one reference model to determine one or more characteristics of the battery cell, the reference model having been previously generated using previously collected acoustic response signal data and non-acoustic data of a plurality of batteries, the reference model receiving the acoustic response signal data of at least the portion of the battery cell as input; and generate one or more actionable insights using the one or more characteristics.

In another aspect, the one or more characteristics include one or more performance characteristics, state of charge, state of health, construction quality, or expected lifecycle of the battery cell.

In another aspect, the one or more processors are configured to execute the computer-readable instructions to update the at least one reference model using the test result and the one or more actionable insights.

In another aspect, the one or more processors are configured to execute the computer-readable instructions to generate the at least one reference model by performing signal processing on the previously collected acoustic response signal data of the plurality of batteries to yield processed signals; determining one or more metrics from the processed signal; and generate the at least one reference model using the one or more metrics.

In another aspect, the one or more metrics are determined by applying a machine learning technique to derive the one or more metrics from the previously collected acoustic response signal data.

In one aspect, one or more non-transitory computer-readable media include computer-readable instructions, which when executed by one or more processors of a battery testing system, causes the battery testing system to obtain acoustic response signal data of at least a portion of a battery cell, the acoustic response signal data including waveforms generated by transmitting one or more acoustic excitation signals into at least the portion of the battery cell and recording response vibration signals to the one or more acoustic excitation signals; evaluate the battery cell using at least one reference model to determine one or more characteristics of the battery cell, the reference model having been previously generated by applying a machine learning technique to previously collected acoustic response signal data and non-acoustic data of a plurality of batteries, the reference model receiving the acoustic response signal data of at least the portion of the battery cell as input; and generate one or more actionable insights using the one or more characteristics.

In another aspect, the one or more characteristics include one or more performance characteristics, state of charge, state of health, construction quality, or expected lifecycle of the battery cell.

DETAILED DESCRIPTION

Aspects of the present disclosure are disclosed in the following description and related drawings directed to specific examples. Alternate aspects may be devised without departing from the scope of the present disclosure. Additionally, well-known elements will not be described in detail or will be omitted so as not to obscure the relevant details of the present disclosure.

The word "exemplary" is used herein to mean "serving as an example, instance, or illustration." Any aspect described herein as "exemplary" is not necessarily to be construed as preferred or advantageous over other aspects. Likewise, the term "aspects of the present disclosure" does not require that all aspects of the disclosure include the discussed feature, advantage or mode of operation.

The terminology used herein is for the purpose of describing particular aspects only and is not intended to be limiting of aspects of the present disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the present disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Aspects of this disclosure are directed to example acoustic signal based analysis of objects such as batteries or other electrochemical energy storage structures. In some examples, the acoustic signal based analysis can be based on electrochemical-acoustic signal interrogation (EASI) techniques. For example, an acoustic signal such as an ultrasonic pulse may be transmitted through a battery cell (or a portion thereof) and the transmitted pulse and/or reflections of the pulse from various components or surfaces of the battery cell can be examined and processed. The travel time or acoustic time-of-flight (ToF) of these different signals and/or signal amplitude as a function of time of flight can be measured and analyzed. Such analysis may include determining frequency content of the signals. Furthermore, signal analysis in the context of the present disclosure is not limited to analysis of the entire signal waveform and can also include a windowed analysis where one or more signals within a ToF window is/are analyzed (in time, frequency and/or time-frequency domain).

As described in more detail below, reference models can be generated with ToF signatures or fingerprints and the ToF measurements for a test battery cell can be compared with the reference model to determine correlations and/or deviations. Studying such comparisons can reveal information about the various physical properties of the test battery cell and cell components. Hereinafter, any reference to a test battery or battery cell can also include battery cell components and subsequently information revealed through aforementioned analysis about a battery under testing can refer to (1) information about the battery cell under testing and associated performance and/or (2) information about individual, subgroup and/or all component of the battery under testing.

The EASI techniques can be used for batteries under various charge conditions, as well as batteries which may be electrically isolated, or when connected to a load or charging source, to obtain information under the various conditions. The EASI techniques are discussed in further detail below. Various other acoustic signal based analysis can also be performed. For example, when acoustic signals (or sound waves) propagate through a material, they cause localized pressure changes or vibrations. An increase in the localized pressure of the material may lead to a corresponding increase in the local temperature. The speed of sound increases with temperature, and thus, the local speed of sound increases with an increase in local temperature.

If the sound waves are represented by acoustic signals having different frequencies (e.g., sinusoidal waveforms with different oscillating frequencies) then the different frequencies may have different effects on the material properties of the medium. By introducing sound waves of different frequencies into the material, the response characteristics of the material or sample thereof for the different frequencies may be obtained. The response characteristics may reveal information pertaining to harmonics or resonance frequencies which are unique to each sample. Thus, input acoustic signals with broad frequency content (broadband frequency input) may be used to infer a variety of information about the material or sample thereof through which the acoustic signals pass, where this information may vary based on attributes such as presence of foreign (external) objects inside the battery (sample), feature size, layer thickness, porosity, electrode density distribution, lithium plating after charging a battery cell, solid-electrolyte interphase layer quality, solid fraction in the electrode slurry, etc., of the sample. These techniques of analyzing materials by studying response characteristics of the materials to different frequencies of excitation are referred to as Acoustic Resonance Spectroscopy (ARS).

When the frequencies of the acoustic signals used for probing the materials are in the ultrasonic range, the above techniques are more specifically referred to as Resonant Ultrasound Spectroscopy (RUS). In ARS/RUS, the acoustic signals are modulated to a desired range of frequencies to be used in the diagnosis of materials such as batteries or components thereof. The ARS/RUS analysis may use acoustic signals of uniform amplitudes. For obtaining information pertaining to non-homogenous characteristics or nonlinearities in the batteries, acoustic signals of varying amplitudes can be used, where such analyses are referred to as a Nonlinear Acoustic Resonance Spectroscopy (NARS) (or more specifically, Nonlinear Resonant Ultrasound Spectroscopy (NRUS) when the frequencies of the acoustic signals are in the ultrasonic range). In some examples, the NARS/NRUS techniques can be used to study response characteristics based on the vibrations caused in a battery from acoustic signals of different amplitudes. The harmonics or resonance frequencies (e.g., by performing a Fourier transform or Fast Fourier Transform (FFT) on the response characteristics) of sound waves of different amplitudes may generate different internal strain fields, where nonlinear (an) elastic properties of the battery will can yield different strain dependent moduli, leading to shifts in the resonance frequencies between response characteristics of acoustic signals having different amplitudes. Studying these shifts, e.g., slopes or curves thereof can reveal information pertaining to the nonlinear properties using the NARS/NRUS techniques.

Thus, in some examples, the information obtained from ARS/RUS or NARS/NRUS for a battery can be different from the information obtained by studying acoustic ToF responses of. Therefore, the acoustic signal based analysis discussed herein can include any suitable combination of such ARS/RUS, NARS/NRUS and/or EASI techniques.

In some examples of EASI, information can be obtained from applying acoustic signals to one or more samples, where the samples can include electrochemical systems such as batteries. The data obtained from studying acoustic signals transmitted and/or reflected through a sample may be processed to determine one or more metrics (and/or markers) which may have strong correlations to characteristics of the sample. Such characteristics can include a state (e.g., pertaining to mechanical, physical, electrical, and/or chemical states or combinations thereof), health, history of use or handling, or future performance capacity of the sample. In some examples, the metrics may be determined fully or partially using machine learning techniques. In some examples, the metrics may be used for generating a reference model against which other samples may be measured. In some examples, the reference model can be specific to a particular battery type and generated from data obtained from the same type or class of batteries being analyzed. In some examples, the reference model can be more general, and may be generated using information obtained from different types of batteries. Different types of reference models may be useful in particular situations. Furthermore, a combination of different models may be used for testing particular batteries and/or a suitable reference model can be used based on the use case or a particular battery under testing.

By comparing metrics of a test sample with the corresponding metrics of a reference model, one or more states of the test sample (e.g., pass or failed, expected charging lifecycle, operability range, etc.) can be obtained. The reference metrics as well as the reference models can be dynamically updated using real time outputs or additional test output data. In some examples, the disclosed learning techniques can be used for training and updating the reference models.

In some examples, the techniques described herein can be used for analyzing fully assembled batteries which have been produced and possibly deployed, or while under use. In some examples, the techniques herein can also be used for analyzing batteries in various stages of their construction or manufacture. It is also possible to use the disclosed techniques for studying internal components of a battery, such as electrode coatings, separator membranes, electrolyte, packaging, etc., during manufacture, or in fully assembled batteries deployed in the field.

Furthermore, systems and techniques described herein can be applied to testing and analysis of batteries, as standalone devices, and/or batteries inside devices using broadband frequency input as described above (may be referred to as an echostat process) and/or resonance measurement techniques where acoustic signals with a wide range of frequencies are sent through the device (e.g., using an ultrasonic transmitter as described in more detail below) under test with resonant frequencies being received by an ultrasonic receiver as one relatively larger waveform (e.g., a chirp). This may be referred to as a resostat process.

In an example implementation, the EASI techniques can be applied to a battery cell (also referred to as a "battery" or a "cell") by transmitting one or more acoustic input excitation signals into the battery cell, measuring the response signals thereof, and analyzing and studying the response signals. The input excitation signals can include one or more pulses such as ultrasonic pulses, or other acoustic signal waveforms such as chirps, sinusoidal signals, square waves, white noise signals, etc. The response signals may include the waveforms generated due to transmission of the excitation signal through the battery cell and also due to reflection (or echoes) of the transmitted excitation signals, e.g., from internal components or external packaging of the battery cell. Such response signals can include a single waveform collected at acoustic signal receiving transducers or sensors ("Rx transducer(s) or sensors) or multiple waveforms taken at different points along a tested object such as a battery cell. Such waveforms can be collected and analyzed as described in detail below to extract additional metadata. Waveforms corresponding to response signal(s) can be spatially resolved (e.g., taken at different points along a battery cell, as shown by Tx transducers 144$a$-$c$ in FIG. 1C and/or different ones of sensors 206 at different locations of the battery in FIG. 2A, both of which are described in more detail below) and then combined to provide additional aggregate metrics on the battery or the subject under testing such as smoothness of cell(s) across which the waveforms are measured (e.g., through amplitude of the corresponding waveform), positions of the cells, etc.

In some examples, means for transmitting the excitation signals such as transducers (referred to as Tx transducers, which may be piezoelectric transducers or other sources of mechanical vibrations) may be used for transmitting the excitation signals. A controller or ultrasonic excitation signal generator may provide electrical signals to the Tx transducers for generating and transmitting acoustic excitation signals of desired amplitude, frequency content, duration, waveform, etc. Means for sensing or receiving acoustic responses (or "Rx transducers") to the transmitted excitation signals may be used for sensing or receiving the response signals. The Rx transducers may include suitable sensors (e.g., piezoelectric transducers, accelerometers, etc.) for receiving the response signals and converting them to electrical signals. The same controller or a different receiver may include means for receiving, recording, storing, processing, etc., the electrical signals from the Rx transducers. The received signals may be stored, for example, in a database or storage structure for further processing. The transmitted and/or response signals can constitute the waveforms for the battery cell which may be analyzed for determining various characteristics according to example techniques.

A processing means in communication with the controller may be used for analyzing the transmitted and/or response signals to determine information regarding various characteristics of the battery cell. In some examples, the processing means can include one or more processors which can be local and/or remote with respect to the battery cell, the transducers, and the controller. One or more processors may be configured to analyze the waveforms (e.g., the transmitted and/or response signals) in the time domain, the frequency, and/or time-frequency domain to extract acoustic signal features which may have strong correlations with the characteristics of the battery cell which may be of interest. Additionally, one or more non-acoustic data associated with the battery cell may also have a correlation with the characteristics of the battery cell. The acoustic signal features, non-acoustic data, and/or combinations thereof which would provide the strongest indicators for specific characteristics of the battery cell are also referred to herein as the metrics for the battery cell.

In various examples, waveforms can be generated at one or more points or locations on a battery cell. In various examples, the acoustic signal features (processed signal features) which may be obtained from the waveforms or from a part of the waveform (windowed) for a battery cell and/or from cell components can include, but is not limited to, a shift in time of flight, a total signal amplitude, frequency content, first break time, centroid or mean frequency, full width at half of a maximum of a main response peak in time domain, full width at half of a maximum of a main peak in frequency domain, standard deviation, skewness, or kurtosis of frequency distribution, decay rate of the response signal in time domain, area under positive amplitude, area under negative amplitude of the acoustic signals, among others. The non-acoustic data associated with the battery cell can include, but is not limited to, voltage (V), current, capacity (Q), dV/dQ, temperature, resistance, impedance, weight, self-discharge rate, thickness, X-ray and CT-scan measurements data, teardown optical and SEM images, etc. The characteristics of the battery cell which may be of interest can include, but is not limited to, a state of charge (SOC), state of health (SOH), construction quality, expected performance quality, expected cycle lifetime, remaining useful lifetime, state of power, state of electrolyte wetting, state of safety, type of battery cell (active materials or chemistry, e.g.), supplier identity, electrolyte distribution through the battery cell, battery cell fabrication process, protocol variations, battery cell quality, ideal soaking time, process drifts, protocol variations, voltage, or cell capacity fade over lifetime etc. Example aspects of this disclosure include identifying one or more metrics (e.g., including combinations of one or more acoustic signal features and/or one or more non-acoustic data) for analyzing one or more characteristics of the battery cell.

Figure 1B:
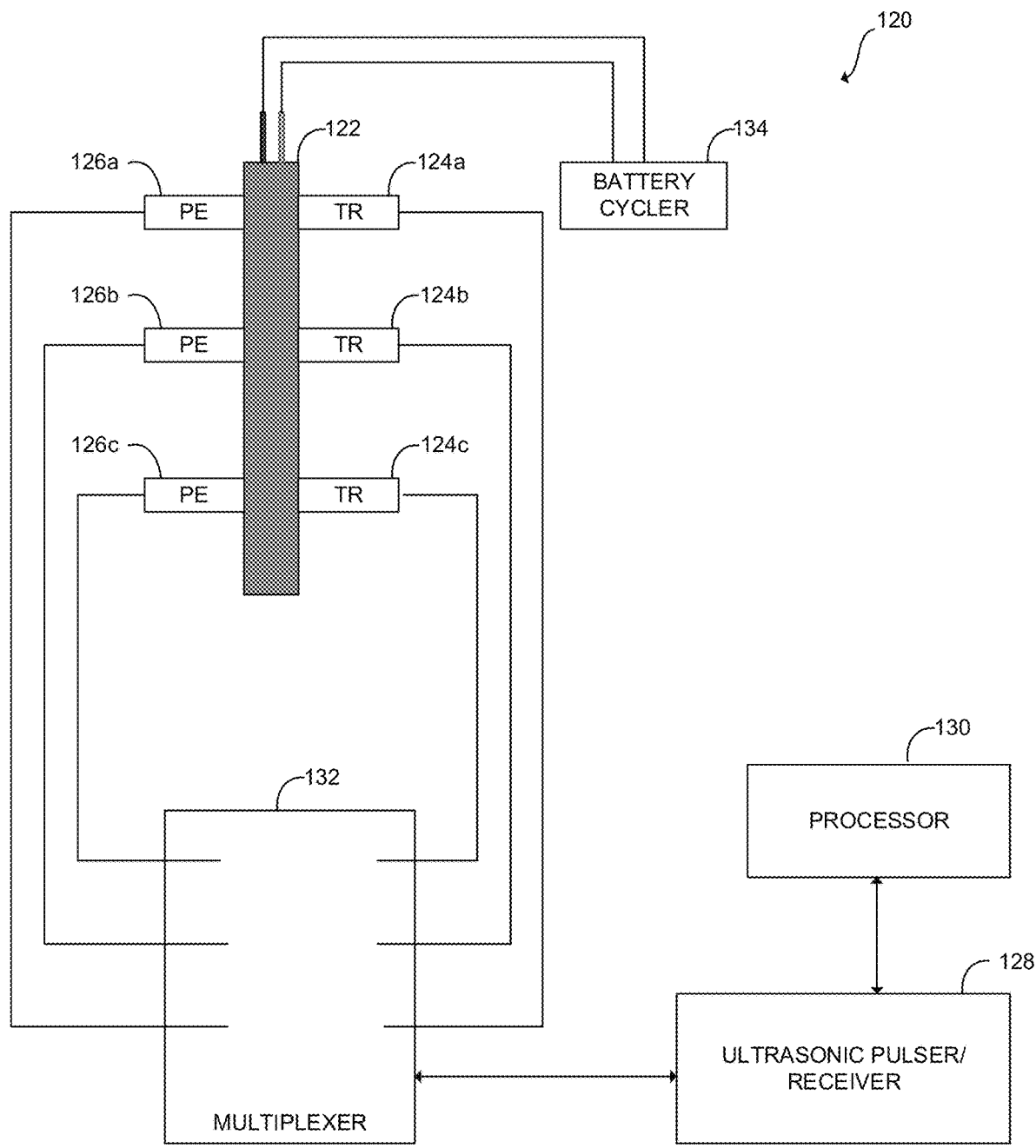
Figure 1C:
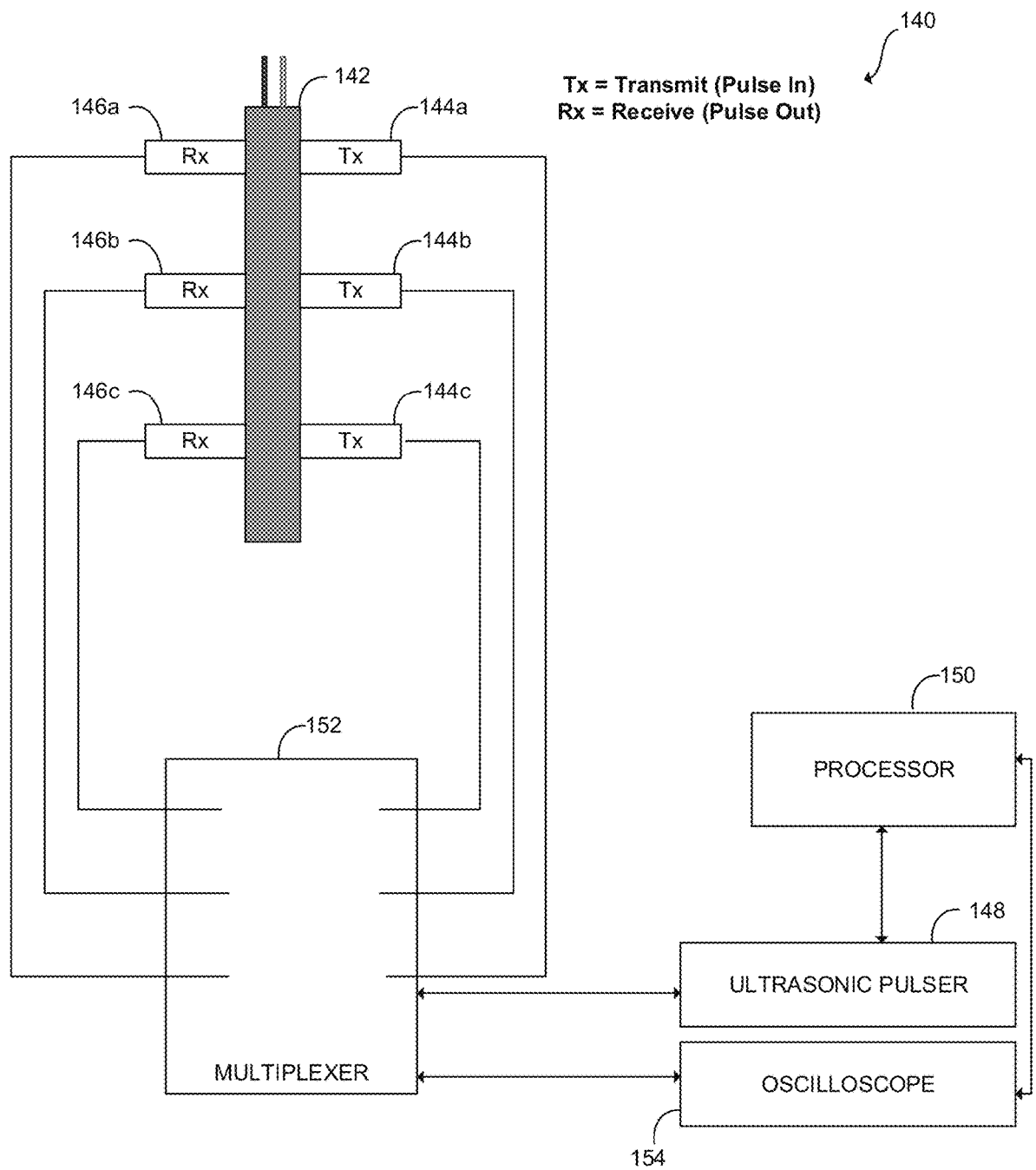

FIG. 1A-C illustrates example systems for analyzing a battery cell using acoustic signals, according to some aspects of the present disclosure. FIG. 1A shows an example system 100 for analyzing a battery cell 102 using acoustic signals, according to some aspects of the present disclosure. FIG. 1B and FIG. 1C discussed further below show systems 120 and 140, respectively, directed to example alternatives among other possible variations to the system 100. The system 100 can include a transmitting transducer Tx 104 or other means for sending excitation sound signals into the battery cell (e.g., for transmitting a pulse or pulses of ultrasonic or other acoustic waves, vibrations, resonance measurements, etc., through a battery cell such as battery cell 102). The system 100 can further include a receiving transducer Rx 106 or other means for receiving/sensing the sound signals, which can receive response signals generated from sound signals transmitted by the Tx or transmit transducer 104. The transmitted signals from the Tx transducer 104, from the side of the battery cell 102 on which the Tx transducer 104 is located may include input excitation signals. Reflected signals, e.g., from another side of the battery cell 102 on which the Rx or receiver transducer 106 is included, may include echo signals. It is understood that references to response signals may include both the input excitation signals and the echo signals. Further, the Tx transducer 104 may also be configured to receive response signals, and similarly, the Rx transducer 106 may also be configured to transmit acoustic signals. Therefore, even though separately illustrated as Tx and Rx, the functionalities of these transducers may be for both sending and receiving acoustic signals. In various alternatives, even if not specifically illustrated, one or more Tx transducers and one or more Rx transducers can be placed on the same side or wall of the battery cell 102, or on different (e.g., opposite) sides.

System 100 can further include an ultrasonic pulser/receiver 108 shown in FIG. 1A coupled to the Tx and Rx transducers 104, 106. The ultrasonic pulser/receiver 108 may include a controller (not separately illustrated here) for adjusting the amplitude, frequency, and/or other signal features of the transmitted signals. The ultrasonic pulser/receiver 108 may also receive the signals from the Rx transducers 106. In some examples, the ultrasonic pulser/receiver 108 may be configured as a combined unit, while in some examples, an ultrasonic pulser for transmitting excitation signals through the Tx transducer 104 can be a separate unit in communication with a receiver for receiving the signals from the Rx transducer 106. The processor 110 in communication with the ultrasonic pulser/receiver 108 may be configured to store and analyze the response signal waveforms according to this disclosure. Although representatively shown as a single processor in FIG. 1A, the processor 110 can include one or more processors/processing units, including remote processors, cloud computing infrastructure, etc.

Although not explicitly shown in FIG. 1A, more than one Tx transducer and/or more than one Rx transducer can be placed in one or more spatial locations across the battery cell 102. This allows studying a spatial variation of acoustic signal features across the battery cell 102. For example, FIG. 1B shows the system 120 with two or more transmitters PE 124a-c (which can be the same as a Tx referenced throughout the present disclosure) of excitation signals and two or more receivers TR 126a-c (which can be the same as Rx referenced throughout the present disclosure) for receiving response signals. By placing the transmitters 124a-c at two or more locations across the battery cell 122, acoustic signals may be transmitted at two or more locations on the battery cell 122. The two or more receivers 126a-c may be placed at two or more locations across the battery cell 122 to collect response signals based on the acoustic signals transmitted from one or more of the Tx transducers 104.

The system 120 of FIG. 1B can include an ultrasonic pulser/receiver 128 similar to ultrasonic pulser/receiver 108 of FIG. 1A (which can include a combined unit or a combination of different units as previously mentioned) for controlling the transmitted excitation signals from the two or more transmitters 124a-c and receiving the response signals from the two or more receivers 126a-c. A multiplexer 132 can be configured in communication with the ultrasonic pulser/receiver 128 for separating and channeling the excitation signals to be transmitted and the response signals received. A processor 130 can be used for analyzing the transmitted and response signals.

Further in some examples, the system 120 can include a battery cycler 134. The battery cycler 134 can be used for charging and discharging the battery 122. This allows studying the battery cell 122 under various charge conditions or states of charge. For example, the battery cycler 134 can take the battery cell 122 through one or more charging and discharging cycles to allow an acoustic signal analysis to be conducted at various states of charge, which can provide valuable information about the battery cell 122.

FIG. 1C shows another example system 140, with two or more transmitters 144a-c of excitation signals and two or more receivers 146a-c for receiving response signals, placed at respective locations on a battery cell 142 (similar to the system 120). The system 140 can also include an ultrasonic pulser/receiver 148 and a processor 150. Additionally, the system 140 can include an oscilloscope 154 or other means for receiving signals, where a multiplexer 152 can be configured in communication with the ultrasonic pulser/ receiver 148 and the oscilloscope 154 for separating and channeling the various signals. In some examples, individual receivers (e.g. oscilloscopes or analog to digital converters (ADCs)) can be included for separate Rx transducers. In some examples, different multiplexers may be used for the transmitted signals and the response signals.

In some examples of the systems 100, 120, and/or 140 discussed above, a reference model can be generated using one or more reference battery cells. A selected arrangement of one or more transmitters and one or more receivers of acoustic signals can be used for acoustic signal analysis of the one or more reference battery cells. In some examples, a set of one or more metrics may be used for generating a reference model against which other samples may be measured. For example, a selected combination of one or more acoustic signal features and optionally, one or more non-acoustic data points for a reference battery (where the combination of metrics may be collected at a single time instance or at two or more time instances over a period of time) may be used for generating the reference model. Corresponding metrics of a test sample may be measured against and compared to the reference model's metrics. The measurements or comparisons can reveal deviations of certain characteristics of the test sample from those of the reference model. These deviations can be used to determine, estimate, or predict the one or more states of the test sample. The metrics as well as the reference models can be dynamically updated as more data is collected from test samples. In some examples, learning tools such as machine learning and artificial intelligence can be used in dynamically updating the reference model.

In some examples, the same arrangement of the one or more transmitters and the one or more receivers may be used to obtain the metrics such as the acoustic signal features across different battery cells, e.g., a test battery cell and a reference battery cell. The metrics can be used to generate a respective test data set comprising the acoustic signal features of the test battery cell and a reference data set comprising the acoustic signal features of the reference battery cell may be collected. Appropriate comparisons may be made between the test data set and the reference data set to correlate any variations between the two data sets to the characteristics such as physical properties of the test battery cell, for example.

In some examples, the test battery cell and the reference battery cell may be the same battery cell at different stages of battery production or manufacture. For instance, the reference battery cell may have a certain level of electrolyte fill, while the test battery cell may have a greater or lower level of electrolyte fill. In some examples, the reference battery cell may be at a certain production stage, while the test battery cell may be at an earlier or later production stage.

Furthermore, the placement and type of the transmitters and/or receivers used can be customized based on the type of analysis, size, shape, and geometry of the battery cell under test and/or any other factor. In some examples, the transmitters and/or receivers can include single element transducers distributed in any regular linear or two-dimensional shape. In some examples, the transmitters and/or receivers can include transducers distributed in an array. In some examples, the transmitters and/or receivers can include multi-element arrays distributed in a linear array or a two-dimensional matrix. In some examples, the transmitters and/or receivers can include phased array transducers. In the various above-described examples, the transmitters and/or receivers may be placed by any suitable means (e.g., actuators, mechanical arms, screws, adhesives, etc.) to be in contact with a surface of the battery cell 102. In some examples, a couplant material (e.g., elastomer, gel, oil, fluid, etc.) may be used as a waveguide and/or to ensure proper mechanical contact between Tx/Rx transducers and the battery. Alternatively, the Tx and/or Rx transducers 104, 106 may be placed in proximity to the battery cell 102 in a manner which allows them to send and/or receive the acoustic signals into/from the battery cell 102, respectively.

Figure 1D:
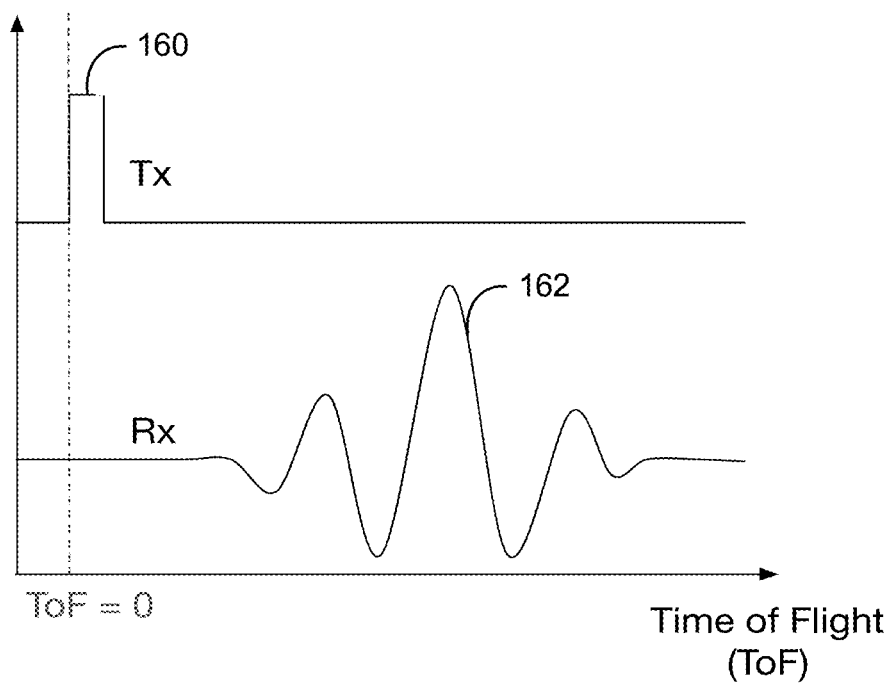
FIG. 1D shows an example of an acoustic signal which may be transmitted through a battery, according to some aspects of the present disclosure.

FIG. 1D shows an example of an acoustic signal which may be transmitted through a battery, according to some aspects of the present disclosure. Such signal may be transmitted by the Tx transducer 104 of the system 100. In an example, the Tx transducer 104 may transmit an excitation signal which includes an acoustic pulse (e.g., an ultrasonic pulse) into the battery cell 102. The Tx signal 160 is shown as a single pulse according to this example. However, in various other examples, the excitation signal can include other signal formats such as chirps, sine waves, square waves, white noises, etc., which can be used in EASI or other types of acoustic signal analysis such as RUS/NRUS, etc. The Rx signal 162 is the response signal generated by the transmission of the Tx signal 160, shown in this example to be a sinusoidal wave. The Rx signal 162 may be received by one or more of the Rx transducers 106.

In some examples, one or more acoustic signal features for the battery cell 102 can include features pertaining to the Tx signal 160 and/or the Rx signal 162. These features may be in the time domain, the frequency domain, a time-frequency domain, etc. An example metric or acoustic signal feature can include a time-of-flight (ToF) of a signal, which refers to the time taken for a signal or portion thereof to travel through the battery cell 102 or a portion thereof. For example, the ToF of the Tx signal 160 refers to the time lapsed from the time instance (ToF=0) at which the Tx signal 160 was transmitted into the battery cell 102, and the time instance for any portion of the Rx signal 162 to be received by an Rx transducer 106. Another example metric or acoustic signal feature can include a first break time, which corresponds to the break time of the first harmonic of the response Rx signal 162. Similarly, another acoustic signal feature can include a first peak of the Rx signal 162, the amplitude of the Tx signal 160 and/or the amplitude of the Rx signal 162.

Figure 1E:
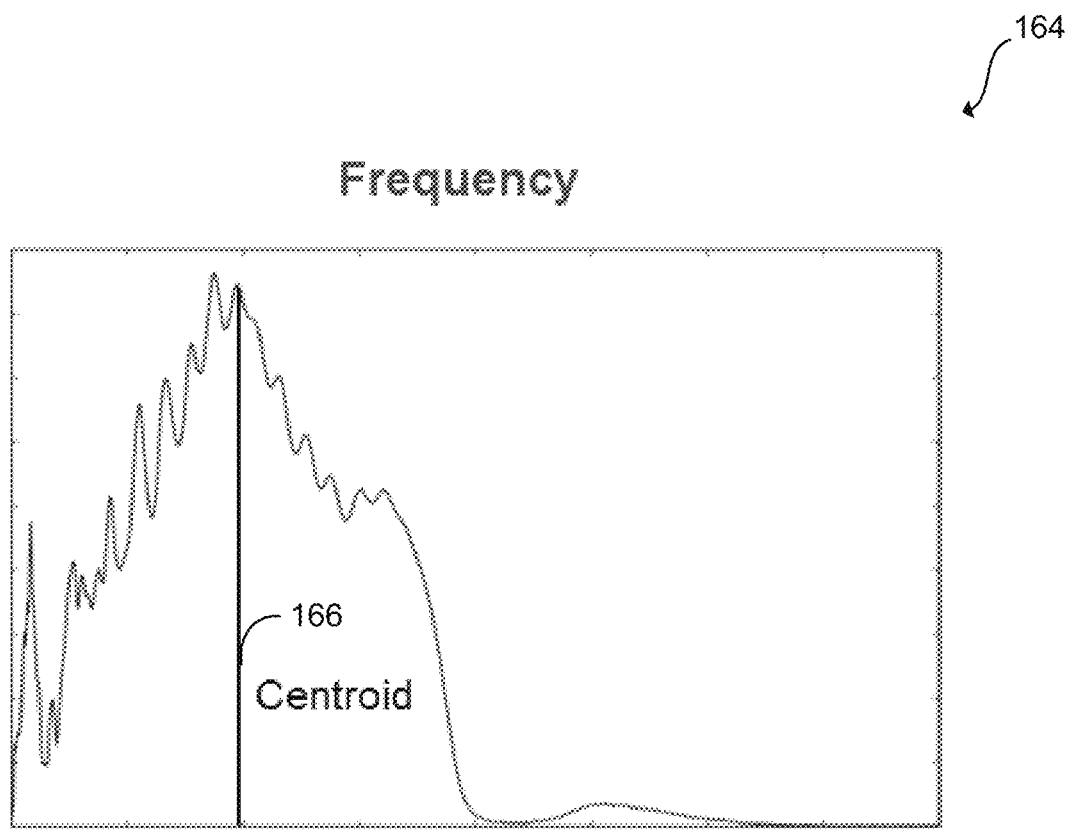
FIG. 1E shows a frequency domain waveform, which may be obtained by performing a transformation son an acoustic signal transmitted through a battery, according to some aspects of the present disclosure.

FIG. 1E shows a frequency domain waveform, which may be obtained by performing a transformation on an acoustic signal transmitted through a battery, according to some aspects of the present disclosure. FIG. 1E shows a frequency domain waveform 164, which may be obtained by performing a transformation such as a fast Fourier transform (FFT) on the time domain Rx signal 162. The waveform 164 provides an indication of the distribution of the frequencies contained in the Rx signal 162. The frequencies in the Rx signal 162 may have a range, from relatively low to relatively high frequencies. Statistical analysis of the waveform 164 can reveal the distribution of the frequency content. For example, signal features such as a centroid (or mean) frequency 166, frequency standard deviation, etc., may be derived from the waveform 164. These signal features may provide an indication of the distribution of the frequency content in the Rx signal 162. For example, if the Rx signal 162 contains a large amount of low frequencies, then the centroid frequency obtained from the waveform 164 may be relatively low. Conversely, if the frequency content of the Rx signal 162 is biased towards higher frequencies, then the centroid frequency obtained from the waveform 164 may be relatively high.

In an example of associating metrics with characteristics of a battery cell, electrolyte wetting may be considered. It is understood that liquids may attenuate higher frequencies of an acoustic Tx signal 160 passing through, which means that the resultant Rx signal 162 may have more low frequency content for response signals obtained from areas of the battery cell 102 which have liquid content. Thus, the centroid frequency obtained from the waveform 164 for the liquid portions will be relatively low. Conversely, porous solids may transmit the higher frequencies of the acoustic Tx signal 160 passing through, which means that the resultant Rx signal 162 may have more high frequency content for response signals obtained from porous areas of the battery cell 102 which are saturated with liquid electrolyte. Thus, the centroid frequency obtained from the waveform 164 for the porous solid portions will be relatively high. In some example aspects, a spatial distribution of the centroid frequencies for signals obtained from various locations of a battery cell may be obtained, based on which, inferences may be made as to one or more characteristics of the battery cell, such as the composition (liquid, solid, level of saturation, etc.) of the regions of the battery cell 102 through which the acoustic signals may have traveled.

In another example of associating metrics with characteristics of a battery cell, fast charging may be considered. Fast charging is a process by which a battery is charged at a relatively high rate (e.g., two to three times the battery's capacity per hour). Fast charging can be problematic because of high charge current that can increase the likelihood of plating lithium metal inside a battery cell. Lithium metal can plate out of solution onto the surface of the anode in a thin layer. The lithium metal plating can be difficult to detect electronically and can lead to fires. Moreover, lithium metal plating may not be even across the entire battery cell. Therefore, using acoustic signals sent through the test battery and the analysis techniques presented herein, spatial measurements across a cell can be repeatedly obtained (an example of metrics) and lithium metal formation at different parts of the cell can be identified and detected (an example characteristic of a battery). The same process as described below with reference to FIGS. 3-7 for processing and analyzing acoustic signal response data of acoustic signals transmitted through and received from a battery under testing to determine one or more characteristics of the battery and/or components thereof, can be equally applied to the fast charging example described above.

Figure 1F:
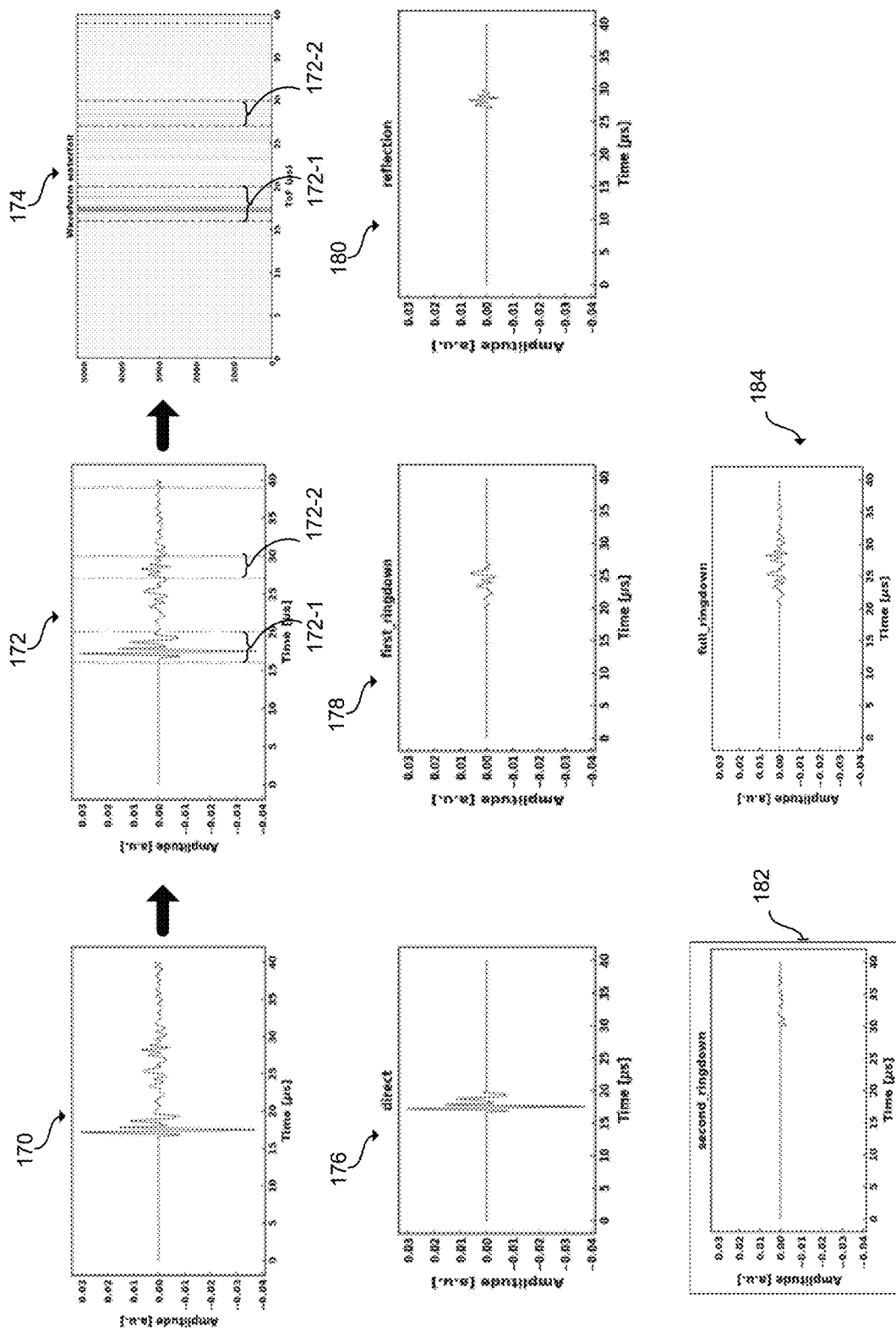
FIG. 1F illustrates examples of windowed analysis of acoustic response data, according to some aspects of the present disclosure.

FIG. 1F illustrates examples of windowed analysis of acoustic response data, according to some aspects of the present disclosure. As noted above, signal analysis in the context of the present disclosure for determining one or more characteristics of a battery cell or component(s) thereof under testing is not limited to analysis of the entire signal waveform and can also include a windowed analysis where one or more signals within a ToF window is/are analyzed (in time, frequency and/or time-frequency domain. FIG. 1F provides non-limiting examples of such windowed analysis.

For example, as shown, acoustic response signal (raw data) acquired by an Rx transducer or sensor after transmitting acoustics signal(s) through a battery is obtained. This obtained raw data is shown in plot 170 (e.g., amplitude v. time). In example of plot 170, the raw data is obtained from one position of a battery under testing. Plot 172 (e.g., amplitude v. time) illustrates an example of windowed waveforms 172-1 and 172-2 (may also be referred to as windowing ranges 172-1 and 172-2) of the raw data shown in plot 170. Plot 174 (e.g., positions v. ToF) illustrates an example of waterfall plot (e.g., spectra) of signals within windowed waveforms 172-1 and 172-2.

Figure 2A:
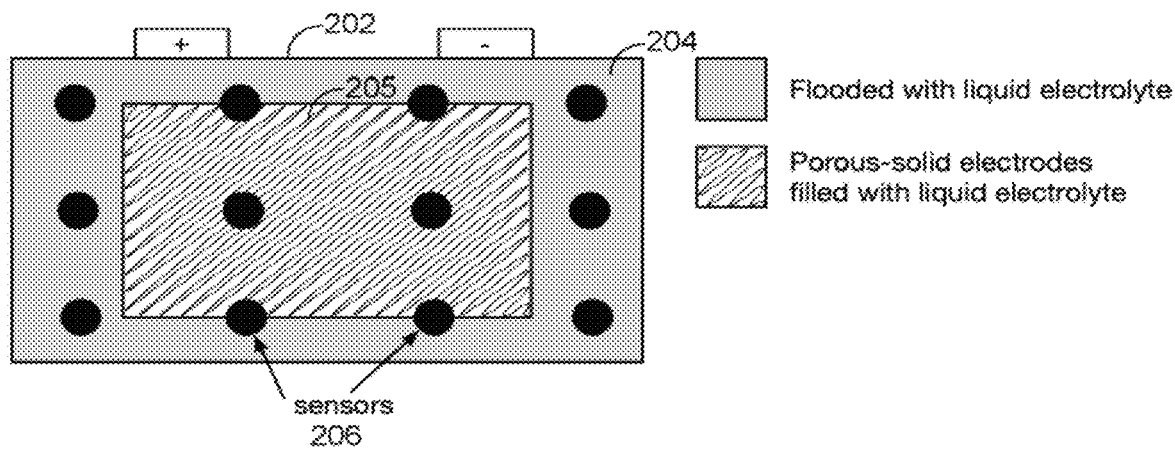
FIG. 2A shows an example composition of a battery cell, according to some aspects of the present disclosure.

One windowed waveforms 172-1 and 172-2 are identified, each windowed waveform 172-1 and 172-2 can be separated into different components such as direct portion 176, first_ringdown portion 178, reflection portion 180, second_ringdown portion 182 and/or full_ringdown portion 154 (e.g., all portions shown as amplitude v. time). Spatial Color maps can be generated with acoustic metrics (centroid freq., amplitude rms, etc.) extracted from each of these windowed waveforms 172-1 and 172-2 from multiple positions across a sample under testing. FIG. 2A shows an example composition of a battery cell, according to some aspects of the present disclosure. In FIG. 2, non-limiting example composition of a battery cell 202 is shown. For the purposes of illustration of example aspects, the battery cell 202 may be a pouch battery cell, with one or more Tx transducers configured to transmit acoustic signals into the battery cell 202 and one or more Rx transducers configured to receive response signals. In the example shown, the sensors 206 may be Rx transducers placed in a 2D array across at least the illustrated surface of the battery cell 202. While not specifically shown in this view, Tx transducers may also be placed on the same surface (for the sensors 206 to sense reflected or echo signals, for example), or a different surface (e.g., opposite surface, for the sensors to sense transmitted signals). In some cases, one or more of the sensors 206 may also include the functionality for transmitting the acoustic signals into the battery cell 202, as well as sensing the response signals.

As shown in FIG. 2A, the composition of the battery cell 202 may vary across the battery cell 202. For example, the schematic view shows that an outer portion 204 may be flooded with liquid electrolyte and an inner portion 205 may contain a porous-solid section filled with or saturated with liquid electrolyte. As one of ordinary skill will understand, the variation in the composition of the battery cell 202 across its body may be more complex and may be less or more homogenous than the depicted example. By studying responses to acoustic signals transmitted through the battery cell 202 (or portions thereof) and extracting acoustic signal features from the responses, it is possible to obtain information about the composition of the battery cell 202.

Figure 2B:
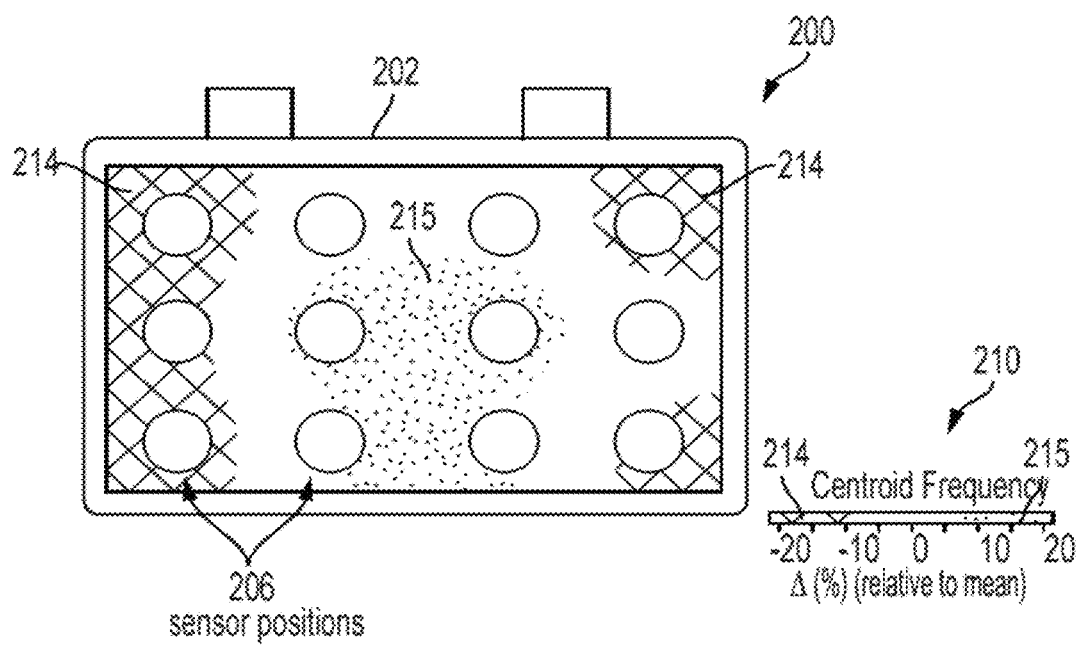
FIG. 2B shows an example view of a spatial distribution of acoustic features of the battery cell of FIG. 2A, according to some aspects of the present disclosure.

FIG. 2B shows an example view of a spatial distribution of acoustic features of the battery cell of FIG. 2A, according to some aspects of the present disclosure. In the depicted example, the acoustic features of the battery cell 202 including centroid frequencies of the response signals collected from sensors, such as the sensors 206 is mapped. More specifically, the sensors 206 may collect response signals (e.g., as shown in FIG. 1E) which are responsive to the acoustic signals transmitted into the battery cell 202. A transformation such as an FFT on the response signals may provide the frequency responses (e.g., as shown in FIG. 1C) for the response signals, from which the acoustic features such as centroid frequency may be derived.

Although the sensors 206 are shown at specific locations on the surface of the battery cell 202, these sensors may be moved or additional sensors may be utilized to collect the acoustic features at numerous locations on the surface of the battery cell 202. In some cases, the acoustic features for certain locations may also be interpolated based on the acoustic features obtained from sensors in other locations (e.g., neighboring locations). A "spatially resolved map" may be created with the acoustic features plotted to cover numerous locations across one or more surfaces (e.g., the entire surface or portions thereof) of the battery cell 202.

Various visualization schemes may be employed for observing the distribution of the acoustic features across the one or more surfaces of the battery cell 202.

In FIG. 2B, the spatial distribution 200 is depicted with different shading schemes to correspond to different centroid frequencies. As seen from the scale 210, the centroid frequencies for the response signals may be in a range from low (214) to high (215) centroid frequencies. The areas marked with corresponding reference numerals on the spatial distribution 200 depict corresponding low centroid frequency area 214 (illustrated with crosshatches) and high centroid frequency area 215 (illustrated with dots) according to the example shown.

FIG. 3 illustrates an example process for obtaining and processing acoustic signal information, according to some aspects of the present disclosure. In some examples, the process 300 described herein can include various automation and machine learning techniques for generating an application model (reference model) to be used for processing raw data obtained by sending ultrasonic/acoustic signals through a battery or battery cells and determining outputs about various characteristics of the battery or battery cells as described above (e.g., state of charge (SOC), state of health (SOH), construction quality, expected performance quality, expected cycle lifetime, remaining useful lifetime, state of power, state of electrolyte wetting, state of safety, type of battery cell (active materials or chemistry, e.g.), supplier identity etc.). Although illustrative examples are used to describe various features, it will be understood that the process flows are applicable to suitable alternatives. For instance, some illustrative examples herein pertain to acoustic signal analysis using EASI techniques. However, the processes can be suitably modified for acoustic signal analysis using RUS/ARS or NRUS/NARS or any other acoustic signal analysis without deviating from the scope of this disclosure.

For example, the process 300 of FIG. 3 can be used for obtaining information for use in acoustic signal analysis of systems such as one or more batteries. In some examples, the process 300 can be used for automatically generating reference models based on identifying features or characteristics for forming the reference models. Additionally, the process 300 can also be used for generating actionable insights, recommendations, alerts, or other notifications for design, manufacture, test, or use of the battery cells.

Considering the example of EASI in a non-limiting and illustrative implementation, the process 300 can be used for determining one or more metrics which may have a strong correlation to one or more characteristics of a battery cell. For example, the one or more metrics can be used in creating a reference model. EASI techniques for studying a test battery can collect information associated with these metrics by analyzing acoustic data of a test battery. The test battery's metrics may be compared with those of the reference model to obtain information related to the physical conditions or characteristics of the test battery. The comparisons or other analysis of the test battery's metrics can also be used to generate insights about the test battery or associated processes for design, manufacture, or use.

Accordingly, in some examples, the process 300 can include an analysis pipeline which may incorporate one or more data analysis mechanisms such as machine learning, artificial intelligence, etc. The process 300 is illustrated as a logical process, the operations of which represent a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

The process 300 may be performed under the control of one or more computer systems (e.g., processor 1120 of FIG. 1A) configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory. In an example of the process 300, raw acoustic data 302 may be obtained from a battery such as the battery cell 102. For example, the raw acoustic data 302 can include wave forms in time domain and/or frequency domain as shown in FIGS. 1D and 1E, collected by studying one or more transmitted acoustic signals from the Tx transducer 104 and response signals obtained from the Rx transducer 106 (or any other combination of transmitters and receivers as described with reference to FIGS. 1B and 1C or other). Raw acoustic data 302 can include single or multiple temporal and/or spatial waveforms. Temporal waveforms can be defined as waveforms corresponding to data collected across multiple time frames at a single position (e.g., using sensor 206 of FIG. 2A). Spatial waveforms can be defined as waveforms corresponding across different points (e.g., using multiple ones of sensors 206 of FIG. 2A) at the same time.

In some examples, the setup for collecting the raw acoustic data 302 can include a single transducer pair comprising Tx transducer 104 and a Rx transducer 106 located on opposite surfaces of a battery cell 102 (e.g., a pouch cell battery). The ultrasonic pulser/receiver 108 may generate an ultrasonic pulse at the Tx transducer 104 and obtain a corresponding response (e.g., a pulse or an echo) at the Rx transducer 106.

In an example, the raw acoustic data 302 can include the waveforms 160 and/or 162 for the Tx transducer 104 and the Rx transducer 106 respectively. In another example, the raw acoustic data 302 can include a vector or a one-dimensional (1D) array of amplitude values recorded at the Rx transducer 106, which can be digitally encoded. The 1D array may represent the echo/sound behavior in the shape of a waveform resulting from the ultrasonic pulse transmitted through the battery cell 102.

For EASI measurements, the waveform may refer to a unit of acoustic data. The waveform can be augmented or supplemented with metadata which can be included along with the waveform for further processing and analysis. In some examples, the metadata can include context information to describe the waveform's generation. For example, the metadata can include waveform information such as sample rate, pulse frequency, amplitude limits, timing information, etc., related to the waveform's generation. The metadata can also include features of the waveform and/or its generation, such as filter settings and statistical information (e.g., multi-sample averaging). The metadata can also include other contextual information like environmental or sample temperature, relative humidity, and stack pressure (i.e., compression on the battery cell 102). The metadata can also include identifying information for the battery cell 102 (e.g., barcode, batch number, manufacturer), etc. In some examples, the metadata can also include information pertaining to the measurement or experiment setup for generating the waveform (e.g., equipment operator, date and time, hardware configuration, and any experimental parameters set by the operator). In some examples, metadata can include information pertaining to the cell which occurred earlier in the process which might influence the measurement. For battery wetting example, such metadata can include retained elyte mass, vacuum time, etc.

The raw acoustic data 302 (e.g., including the waveforms) and associated metadata can include a large quantity of data which may be updated and continue to dynamically grow in volume over time. The raw acoustic data 302 and the associated metadata be periodically or constantly stored in a local data cache (e.g., using formats such as CSV files, HDF5 files, or SQL database), where an example of the local data cache can include a raw waveform database 318. Some or all of the raw acoustic data 302 and the associated metadata can also be transmitted to a remote storage location (e.g., database 318 can be a cloud storage or remote data cache) for storage.

In some examples, it is also possible to process some or all of the raw acoustic data 302 and the associated metadata on-the-fly without involving an intermediate cache or storage. For example, processing the data on-the-fly can produce actionable information for an operator. For this example, the actionable information can inform the operator if one or more metrics for a battery cell under test may have deviated by greater than a predefined threshold from expected or nominal values. Such deviation can indicate to the operator that the battery cell may be defective and would make a candidate for being removed from further processing or be scrapped, or provide actionable repair options to rectify the deviation. For example, a deviation can indicate that a production line may be experiencing drift, contamination, or another systemic issue, and the operator may be enabled to resolve such issues on the fly and mitigate further downstream damage. In some examples, a combination of local and remote storage and on-the-fly processing can be applied to the raw acoustic data 302 and the associated metadata.

In some examples, the raw acoustic data 302 and the associated metadata can be processed post-hoc to further an experimental analysis or to create and improve a reference model, which can in turn also improve the accuracy of actionable information provided to the operator.

In some examples, the local and/or remote storage for above-described data (e.g., a suitable combination of raw acoustic data 302 and the associated metadata) can include a normal Structured Query Language (SQL), a NoSQL database, or some other storage mechanism, such as comma-separated value (CSV) files. In some examples, subsequent data processing operations in the process 300 can be performed on the stored data obtained from the database 318, while in some cases, the raw acoustic data 302 may be directly preprocessed. In some examples, preprocessing 304 can include one or more processing functions including windowing, filtering, resampling, etc., to correct for possible equipment noise and improve resolution. These functions which may be included in the preprocessing 304 block will be described in further detail below.

A filtering function can include applying one or more filters to filter out or remove certain frequency content from a waveform. For example, high frequency components can be filtered out to reduce background noise in waveform. In another example, low frequency components can be filtered out to reduce amplitude offsets. Various other filtering functions are known in signal processing and may be included as needed.

A windowing function may be used to further process or focus only on certain parts of a waveform or signal that have been identified as being the most relevant for a particular outcome. For example, a windowing operation may be used to select a region of a waveform in the time domain and mask the information outside of that region (e.g., as described above with reference to windowed analysis and FIG. 1E). In an example, electrical artifacts can be caused by the equipment that generate the pulses (e.g., ultrasonic pulser/receiver 108), where these electrical artifacts may be manifested in a recorded signal obtained by using the equipment even before any relevant acoustic data is collected and recorded. Windowing can be used in removing such electrical artifacts which can appear in the early stages of the recorded signal.

In another example, windowing functions can be used to constrain the data for further processing to a certain duration of time, e.g., where data in an earlier part of a signal can be more reliable. With respect to the raw acoustic data 302, the signal amplitude at the beginning and end of a measurement time window can be effectively zero in some cases, which means that the contribution to the various metric changes from waves shifting into and out of the measurement window may be negligible from these regions. Therefore, windowing can be used to eliminate such regions which do not contribute significantly to further analysis, thus, reducing the volume and complexity of the data. In another example, windowing functions can be used to extract waveforms due to scattering or reflection from features inside a battery cell under testing.

Resampling operations can include up-sampling and down-sampling. Up-sampling includes adding interpolated values between recorded data points, which can have an effect of smoothing out a waveform, and can improve the results of certain analysis methods, like cross-correlation, that are sensitive to the data's quality. Down-sampling includes removing or readjusting data points to lower the number of values in the signal. Down-sampling can reduce the amount of data (e.g., reduce the size of the 1D data array), which can speed up data transmission, data processing, and reduce the amount of storage and memory resources needed for the data. In some cases (e.g., for swept sine type resostat measurements described above) resampling operations can include resampling into sampling intervals that are synchronous with sine sweep input.

In some examples, after preprocessing 304, the resulting data, referred to as the "preprocessed data" can be transformed from the time domain to the frequency domain and/or time-frequency domains in the transformations 306 block. These transformations can provide the spectral information present in the waveform in a way that is more directly measurable and comparable. In some examples, the transformations may be necessary for determining and obtaining one or more metrics generated in the analysis pipeline or process 300.

In the feature extraction 308 block, the data (e.g., a preprocessed and transformed version of the raw acoustic data 302 and associated metadata) can be analyzed for extracting various metrics, also referred to as features. The data can be distilled into or expressed in terms of one or more individual metrics which can be identified in this block. The metrics or features may encapsulate elements of the data that have relevance to the experiment or process. Numerous metrics can be obtained which may be representative of the data, where studying the metrics can provide desired information about the battery cell. For example, the metrics can include mean or root-mean-squared (RMS) amplitude from the time domain and centroid (mean) frequency from the frequency domain. A combination of one or more metrics can provide an analytical basis of comparison between different sets of data relating to a test cell and a reference cell, for example.

For example, the metrics can reveal which types of variations between a test waveform and a reference waveform may be indicative of characteristics of a test battery. For example, some metrics may be more sensitive to changes in physical features of a battery cell than other metrics. For example, a cluster of data may show a wide variance in amplitude but not mean frequency, which can lead to identification of amplitude as a candidate for a metric or feature to be studied for that data cluster. In an example of a quality control application, the identified metrics can have the largest deviations from their respective reference (or nominal) values.

For example, a manufacturing line producing thousands of battery cells is expected to produce near-identical cells. The nominal metrics may include a statistical composite of metrics from many cells from the same line or production facility, and represents how a good or normal cell should appear in terms of the metrics. The statistical composition can be performed remotely, e.g., leveraging processing infrastructure of a cloud computing infrastructure which may be unavailable on a manufacturing floor. The nominal values, as well as their acceptable ranges, can be generated remotely and returned to the computer systems collecting the data, reducing calculation overhead and simplifying the system needed by the operator on the manufacturing floor.

Another example pertains to electrolyte wetting during battery production. As previously mentioned, electrolyte wetting involves injecting a freshly constructed (dry) battery cell with liquid electrolyte, and allowing the battery cell to remain stable and idle while the liquid electrolyte wets, soaks and permeates the porous materials inside the battery cell. Because of the difficulty in measuring this process at commercial scale, battery manufacturers may conventionally allow the battery cells to remain idle for much longer than necessary to ensure that all battery cells are fully wetted before moving to the next stage of manufacturing. Reducing the average time the battery cells spend in the electrolyte wetting step, as well as identifying which cells do not completely wet (only to be marked as defective much later in the process), can lead to significant reduction in cost of manufacturing for the battery manufacturers and also reduce the number of battery cells which are eventually scrapped for being defective due to insufficient/incorrect wetting.

The EASI measurements can be effectively used for detecting wetting progress within a battery cell by identifying the appropriate metrics which reveal wetting characteristics. For example, using an array of sensors for obtaining numerous points of measurement along the surface of the battery cell as shown in FIGS. 2A-B and determining the amount of liquid present at each of those points, the battery's wetting profile may be created. In the example of analyzing the battery cell's wetting, the metadata associated with the raw acoustic data 302 (i.e., waveforms from the numerous sensors) can include location information of the various sensors at which the waveforms are generated and collected.

In such examples for studying characteristics such as electrolyte wetting of a battery, acoustic signal features of the waveforms such as centroid frequencies may exhibit the largest variation with changes in electrolyte wetting. Thus, metrics such as a range of the centroid frequency values can capture the change in properties (and, in this example, wetting progress) along and throughout the battery cell. Another example metric may include centroid frequency variation which can be obtained by comparing the centroid frequency at the edge of the battery cell to the centroid frequency at the middle of the battery cell. A large number of these aggregate metrics can be generated to describe and understand the desired phenomenon such as the battery cell's wetting profile. These metrics can also be used to build models of how wetting behavior correlates to the acoustic properties. Instead of using cycling data to train a model, known wetting properties can be used. The trained model can be installed on the data collection computer on the manufacturing floor, and configured to produce useful output for the operator (such as "percentage wetted" or "remaining time to complete wetting") in real-time.

Accordingly, once the metrics are identified in the various above-described examples, the metrics can be stored in a feature database 320 for future use. In some examples, the metrics or features which are identified in the feature extraction 308 block may include a large amount of data (e.g., the numerous waveforms and associated metadata for studying electrolyte wetting). Accordingly, these metrics may be further winnowed to minimize or eliminate noisy or irrelevant metrics and obtain a reduced collection of metrics which may have the highest correlation to characteristics of the battery under test.

In the features selection 310 block, algorithms for dimensionality reduction, such as block model-based methods, principal components analysis (PCA), etc., may be used to generate the reduced set of metrics. In some examples, the features selection 310 can identify which metrics, or combinations of metrics, show the largest variation. Those metrics and combinations can then be used as standards (a correlation model) to assess new data, informing the operator of any discrepancies.

An electrical performance database 322 can store the desired performance characteristics for the battery cells. These performance characteristics can include nominal values for voltage, state of charge, state of health, etc. Variations in the metrics can result in variations in the performance characteristics. A feedback path from the database 322 to the correlation and model selection 312 block can allow verification of the outputs of the features selection 310 to the performance. For instance, if a reduced set of one or more metrics have been obtained based on the dimensionality reduction, then performance variations may be measured based on variations in the one or more metrics of the reduced set. Based on the amount of variation in the performance characteristics, the one or more metrics of the reduced set can be validated as appropriate metrics to use in analyzing test battery cells which may have high correlations with the performance characteristics. In this respect one or more supervised (e.g., regression, classification, etc.) models and/or one or more semi-supervised (e.g., clustering) models may be used to in determining which of the one or more metrics of the reduced set may have the strongest correlations in affecting the performance characteristics.

In some regards, the feedback path from database 322 can also include the evaluation engine 316 where the variations in the one or more metrics of the reduced set can be evaluated based on comparisons to ground truths or trusted metrics. For instance, the ground truths may be related to known good reference battery cells. The ground truths can include non-acoustic data in some examples (e.g., voltage, temperature, etc.). In some examples, the ground truths can also evolve over time based on studying various reference battery cells and learning the trusted metrics which have the strongest correlations to the performance characteristics. The ground truths can be updated based on the performance characteristics obtained from the database 322.

Once a collection of the metrics which have the strongest correlation has been finalized in the correlation and model selection 312 block for example, they may be used in generating a reference model. For example, the acoustic signal features and/or other non-acoustic data for a reference battery can be obtained and used for creating a reference model against which future test batteries may be measured. The model can be based on particular applications. For example, a different reference model may be applicable for electrolyte wetting analysis using centroid frequency metrics than that for a production line which may utilize mean frequency metrics. In some examples, one or more reference models can be generated, which can be provided as attested or trusted models. In some examples, the correlation and model selection 312 block can implement one or more supervised or semi-supervised learning algorithms.

Figure 3A:
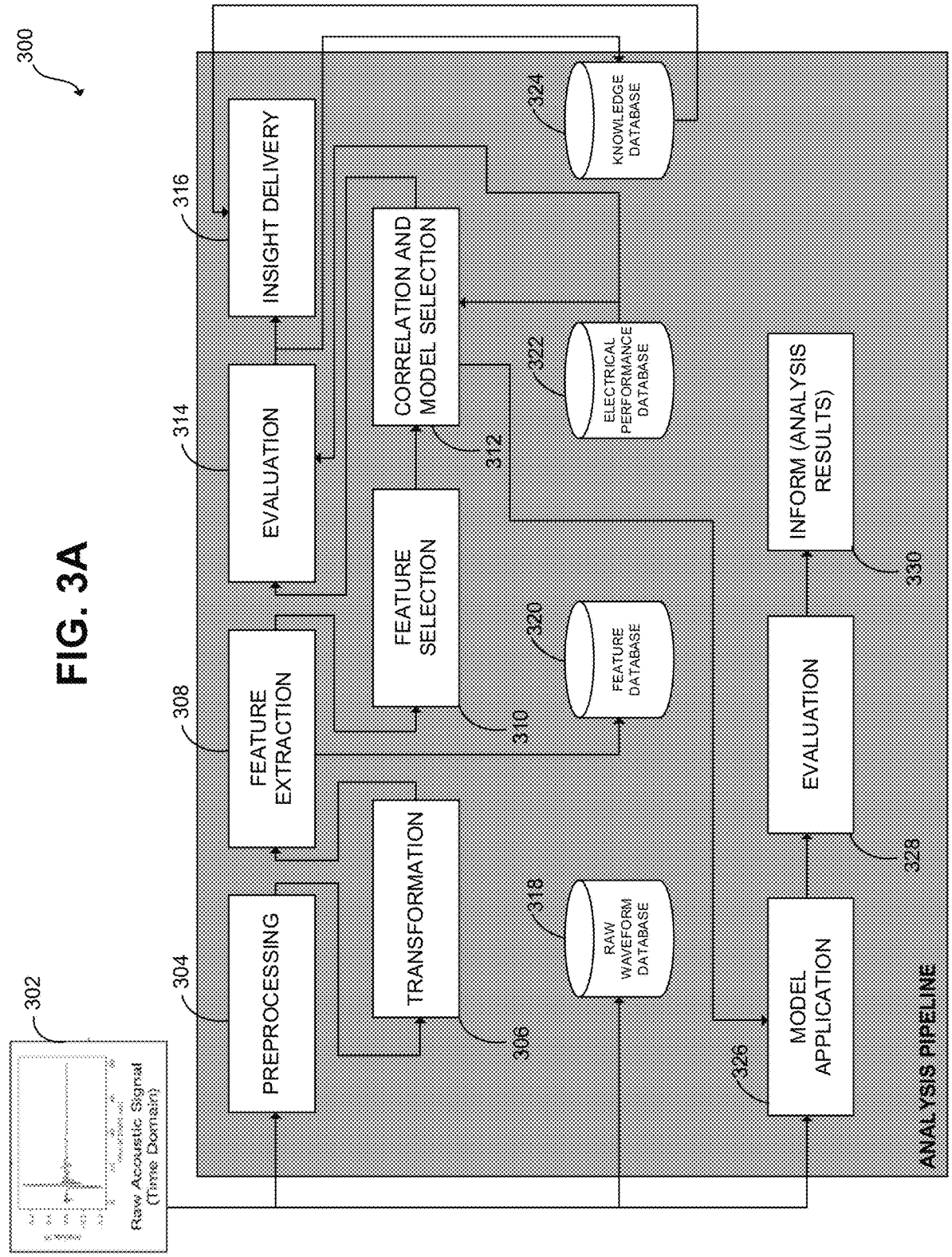
FIG. 3A illustrates an example process for obtaining and processing acoustic signal information, according to some aspects of the present disclosure.
Figure 3B:
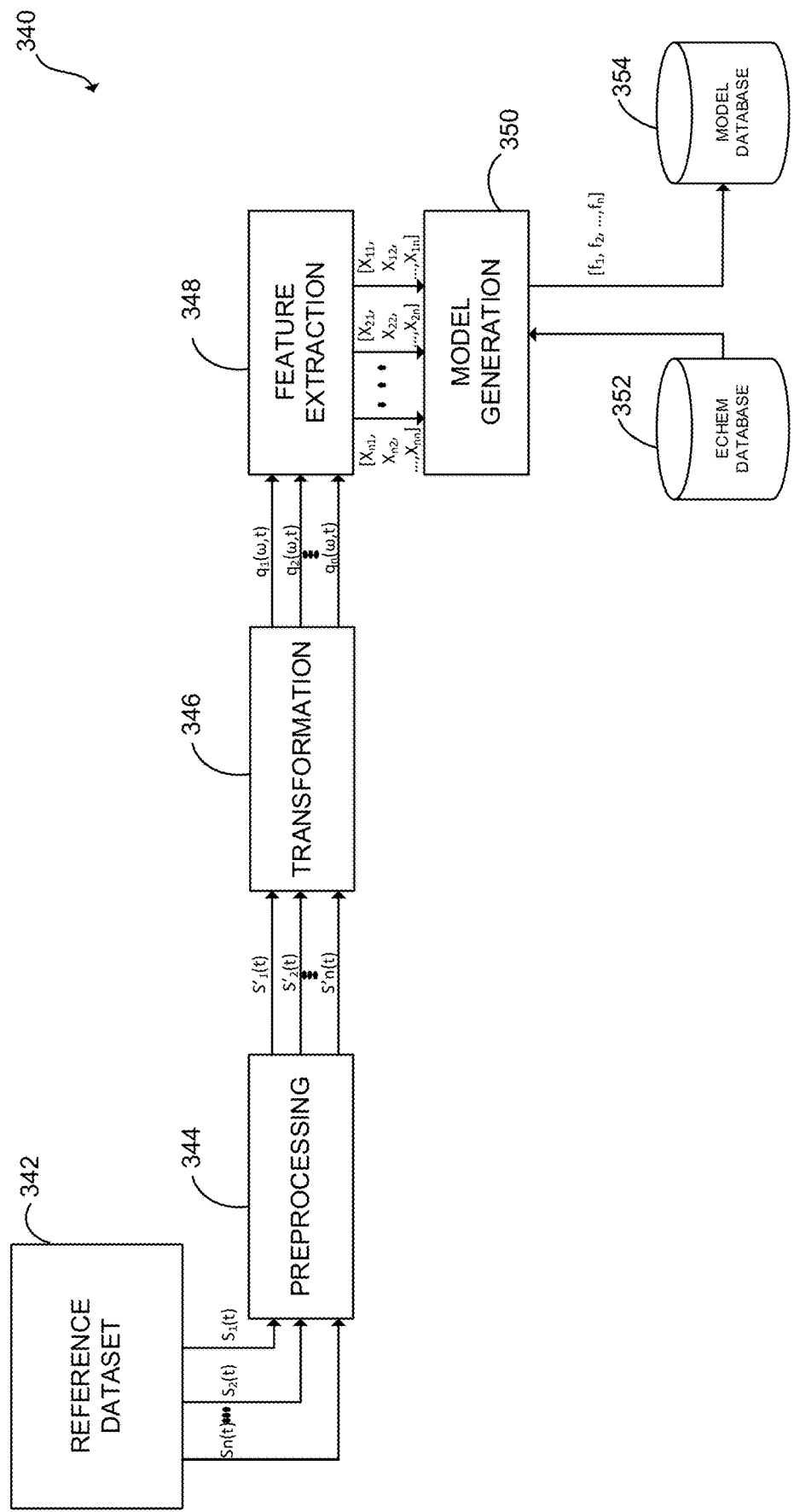
FIG. 3B illustrates an example process for generating a reference model used for processing acoustics signal information, according to some aspects of the present disclosure.

FIG. 3B illustrates an example process for generating a reference model used for processing acoustics signal information, according to some aspects of the present disclosure. More specifically, FIG. 3B illustrates example details of processes performed at blocks 304, 306, 308/310 and 312 of FIG. 3A for generating a reference model.

As shown, pipeline 340 includes a reference dataset 342 block that may include time series of data collected over time of batteries under testing, these signals are represented as $S_1(t)$, $S_2(t)$, ..., $S_n(t)$. Number of time series signals in the reference data set may be one or more (e.g., just $S_1(t)$ or n number of signals with n being an integer greater than or equal to two). At preprocessing 344 block, the time series signals may be preprocessed in the same manner as described above with reference to preprocessing 304 block in FIG. 3A. Output of preprocessing 344 block may be represented as modified time series signals $S'_1(t)$, $S'_2(t)$, ..., $S'_n(t)$ with n being an integer greater than or equal to two. Preprocessed signals may then be transformed (e.g., Fast Fourier Transform) at transformation 346 block in the same manner as described above with reference to transformation 306 block in FIG. 3A. Output of transformation 346 block may be represented as modified time series signals with an additional frequency component w represented as $q_1(\omega,t)$, $q_2(\omega,t)$, ..., $q_n(\omega,t)$ with n being an integer greater than or equal to two. Output of transformation 346 block may be processed by feature extraction 348 block in the same manner as described above with reference to feature extraction 308 block of FIG. 3A. Output of feature extraction 348 block may be a vector of one or more metrics from each signal, represented as $[X_{11}, X_{12}, ... X_{1n}]$ corresponding to $q_1(\omega,t)$, $[X_{21}, X_{22}, ... X_{2n}]$ corresponding to $q_2(\omega,t)$, ... $[X_{n1}, X_{n2}, ... X_{nn}]$ corresponding to $q_n(\omega,t)$, etc. Thereafter, using inputs from electrochemical (echem) database 352 (which may be the same as electrical performance database 322) and model database 354, model generation 350 block may generate one or more reference models. In one example, various functions (e.g., linear combination functions, non-linear combination functions, etc., represented as $[f_1, f_2, ... f_n]$) may be provided to model generation 350 block to generate one or more reference models (e.g., PCA, regression, classification, clustering), which can then be applied (e.g., in real-time) to determine one or more characteristics of a battery under testing and provide relevant insights.

Figure 3C:
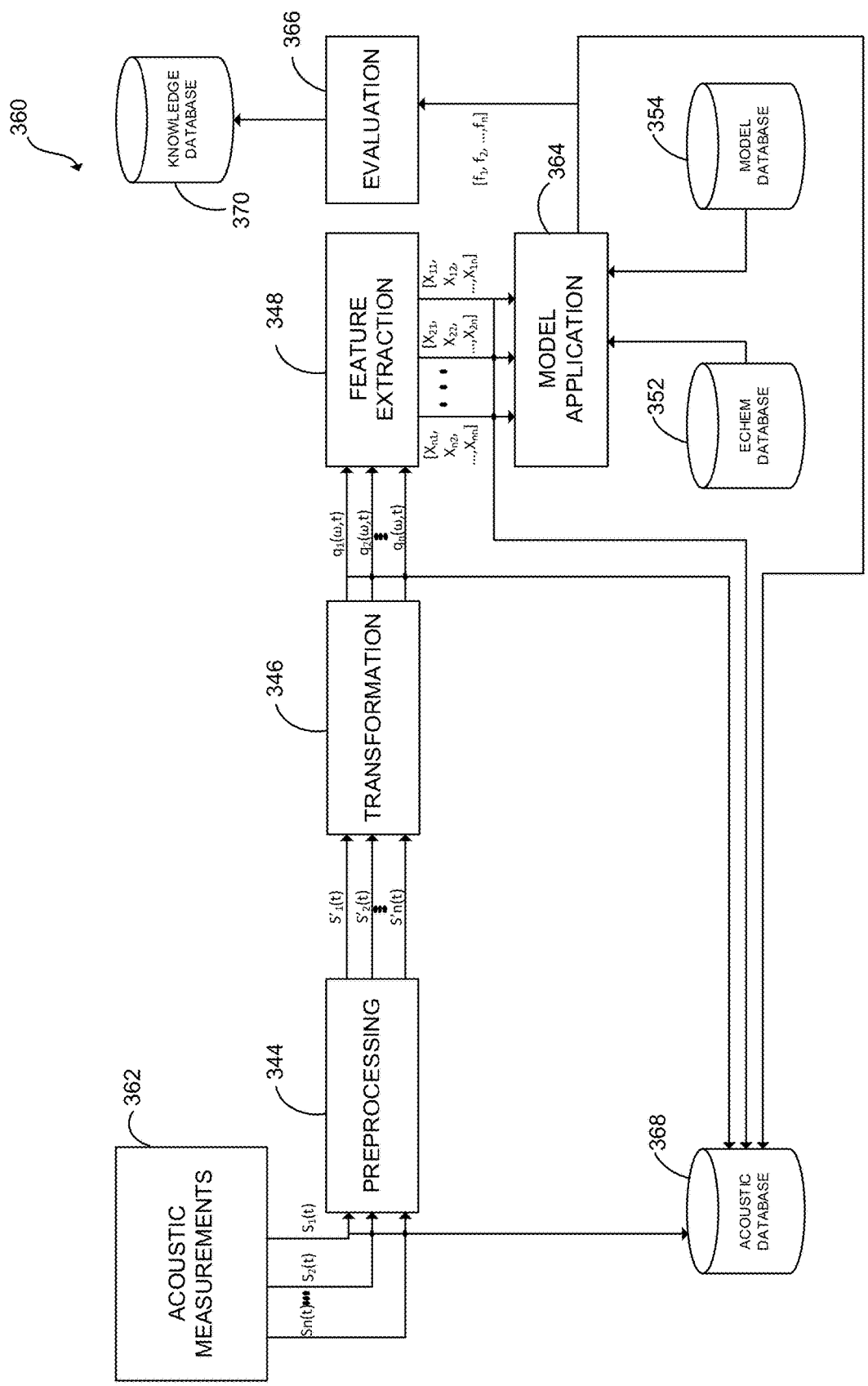
FIG. 3C illustrates an example process for applying a reference model of FIG. 3B for processing acoustic signal information, according to some aspects of the present disclosure.

FIG. 3C illustrates an example process for applying a reference model of FIG. 3B for processing acoustic signal information, according to some aspects of the present disclosure. More specifically, FIG. 3C illustrates example details of applying one or more reference models (e.g., generated at model generation 350 block of FIG. 3B) to process acoustic data collected from a battery under testing (e.g., in real-time), performed at blocks 326, 328, and 330 of FIG. 3A. As shown, pipeline 360, at acoustic measurement 362 block, one or more acoustic measurements across a batter under testing may be obtained (e.g., as described above with reference to FIGS. 1A-F, FIGS. 2A-B and FIG. 3A).

Such collected signals may be preprocessed, transformed and or one or more features thereof extracted at preprocessing 344 block, transformation 346 block and feature extraction 348 block, respectively, as described above. These processes and resulting signals from each block may be the same as that described above with reference to FIG. 3B and thus will not be further described for sake of brevity.

In contrast to FIG. 3B, resulting signals $S_1(t)$, $S_2(t)$, ..., $S_n(t)$ from acoustic measurements 362 block, $q_1(\omega,t)$, $q_2(\omega,t)$, ..., $q_n(\omega,t)$ from transformation 346 block and $[X_{11}, X_{12}, ... X_{1n}]$, $[X_{21}, X_{22}, ... X_{2n}]$, and $[X_{n1}, X_{n2}, ... X_{nn}]$ from feature extraction 348 block may be stored in acoustic database 368 (which may be the same as raw waveform database 318 and feature database 320 of FIG. 3A.

Extracted features $[X_{11}, X_{12}, ... X_{1n}]$, $[X_{21}, X_{22}, ... X_{2n}]$, and $[X_{n1}, X_{n2}, ... X_{nn}]$ may be fed into model application 364 block (which can be the same as model application 326 block of FIG. 3A, where one or more reference models may be applied and then evaluated at evaluation 366 block in the same manner as described above with reference to evaluation 328 block of FIG. 3A in order to determine one or more characteristics of the battery under testing and/or component(s) thereof. As described with reference to FIG. 3A, one or more actionable insights may then be provided at insight 330 block.

Results of model application 364 block may also be stored in acoustic database 368. Moreover, results of evaluation 366 block may be stored in knowledge database 370 for further updating and refining generated reference models of process of FIG. 3B.

Figure 4:
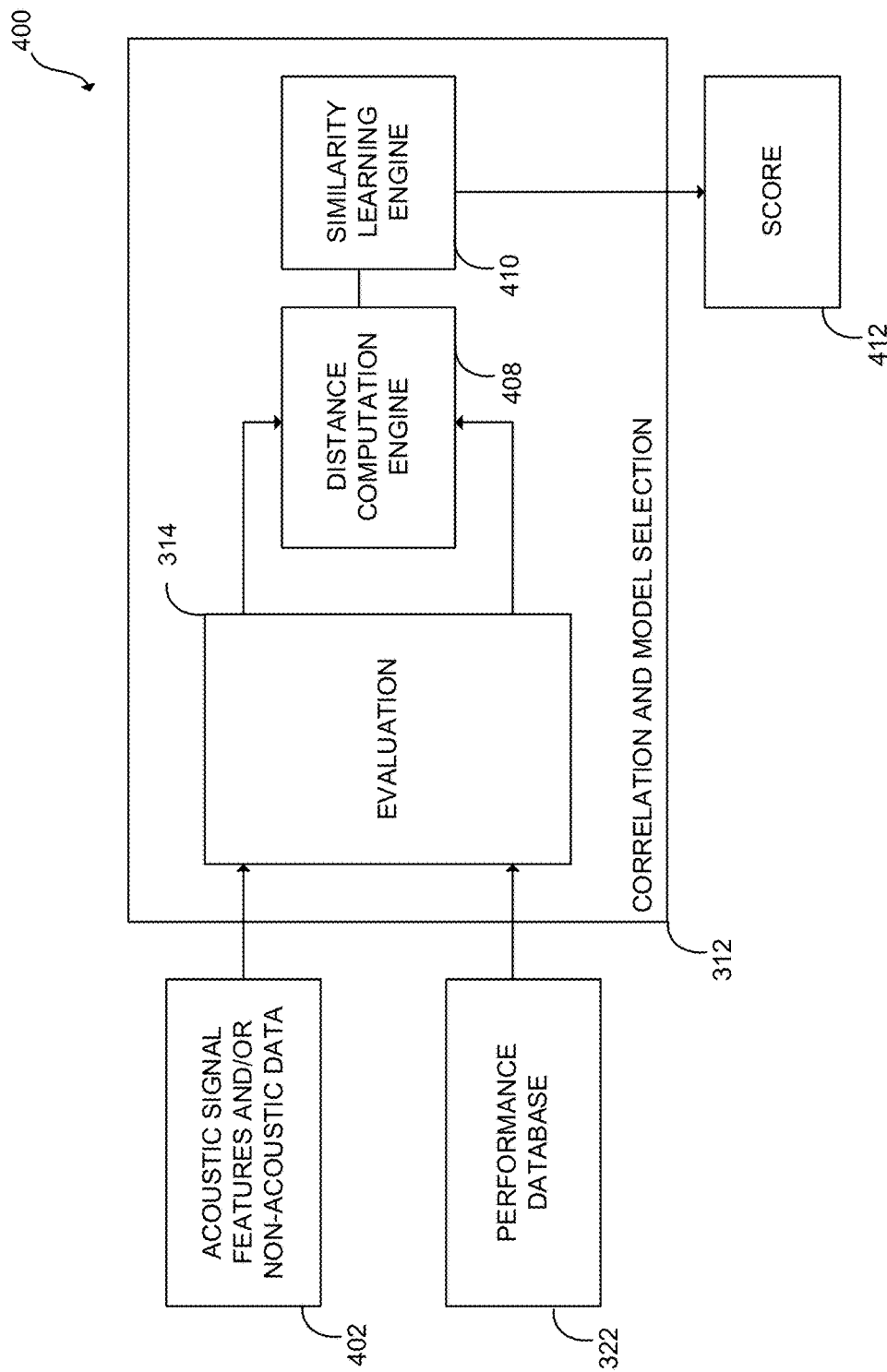
FIG. 4 illustrates an example process that can be implemented as part of the correlation and model selection of FIG. 3, according to some aspects of the present disclosure.

FIG. 4 illustrates an example process that can be implemented as part of the correlation and model selection of FIG. 3, according to some aspects of the present disclosure. In some examples, the features which have been selected by the feature selection 310 block can be evaluated against the performance measured in terms of these features. For example, performance of a battery associated with a set of the acoustic signal features and/or other non-acoustic data 402 can be evaluated against a trusted set of ground truths or other metrics. In some examples, the electrical performance database 322 can include states of charge, battery life, voltage, or other metrics which may be associated with a battery. The acoustic signal features and/or non-acoustic data 402 obtained for the battery can be provided as inputs to an evaluation 314 block. In non-limiting example process 400 of FIG. 4, evaluation 314 block is illustrated as being part of (embedded in) correlation and model selection 312 block.

In some examples, the evaluation 314 block can be configured to evaluate whether the acoustic signal features and/or non-acoustic data 402 obtained are indicative of the battery's performance. For example, the accuracy of the supervised or semi-supervised models which have been used in generating a reference model can be evaluated. A set of trusted ground truths or other metrics can be based on verified or measured training data for a known model. The performance values of a battery model which would be estimated based on the set of acoustic signal features and/or non-acoustic data 402 can be compared with the ground truths in the evaluation 314 block. A distance computation engine 408 can calculate a distance or difference between the estimated performance values and the ground truths. A similarity learning engine 410 can identify the sets of acoustic signal features and/or non-acoustic data 402 whose estimated performance tend to have higher levels of correlation with the ground truths. The output from the similarity learning engine 410 can include a score 421 or other measures indicating how well the correlation and model selection 312 block is performing. Such score may have a scale (e.g., 0 to 5, 0-10, 0-20, etc.) that is a configurable parameter determined based on experiments and/or empirical studies.

Returning to FIG. 3, the score 412 or other output of the evaluation 314 block can be used to generate actionable information, to improve the generated reference model, or other processes. In some examples, an insight delivery 316 block can be used to generate recommendations for battery cell design, process development, process engineering, yield management, predictive maintenance, pack design guidance, etc. For example, when certain deviations have been observed from expected performance, or when certain trigger conditions automatically generated have been identified for a particular battery, these may be used to improve or provide corrective measures in design and/or manufacturing steps. A knowledge database 324 can be maintained with known best practices, which can be automatically updated and used for generating the insights. For example, a score 412 associated with a particular feature set can be used to determine whether any changes may be recommended based on best practices or known ideal conditions which are stored in the knowledge database 324.

In some examples, one or more reference models and knowledge bases created using the process 300 can be used for testing any battery in an efficient manner. For example, the best reference model for use in testing a particular battery may not be known in advance. The reference model generated from the process 300 can be useful in identifying the type of metrics which are to be extracted from acoustic analysis of the test battery and the expected values for such metrics.

Process 300 of FIG. 3 further includes steps for testing a battery cell using a reference model or other information generated at correlation and model selection 312 block. For example, the raw acoustic data 302 for a test battery (which can also for reference model generation and updating as described above) can be obtained using a similar setup such as the system 100/120/140 or other. The raw acoustic data 302 along with associated metadata (e.g., state of charge, temperature, voltage, etc.) can be stored in the raw waveform database 318. Once sufficient data has been accumulated in the raw waveform database 318, one or more reference models can be used at model application 326 block for evaluating the test battery.

For example, the model application 326 block can use one or more reference models, knowledge bases, performance databases, etc. (collectively, "trusted models") to evaluate features extracted from the raw waveform database 318. The feature extraction can be based on the metrics which have been identified as having high correlation to performance or other characteristics to be studied. Thus, a battery of unknown characteristics can be compared against a suitable reference model in an evaluation 328 block. The ground truths and trusted metrics may also be obtained from the processes 304, 306, 308, 310, 312, 314 and/or 316 or generated for the test battery. The results of the evaluation can lead to actionable information or insights, as identified in the inform 330 block, which may also be referred to as analysis results 330 block. For example, the test battery can be determined as being insufficiently wetted using an automatically generated reference model using the process 300 for evaluating the metrics which can indicate wetting and by applying the reference model to evaluate wetting status of the test battery.

In some examples, the above processes can also be used for binning battery cells. For example, newly-constructed battery cells can be sorted into bins of varying quality and expected performance using the analysis pipeline discussed above. For example, the one or more reference models obtained from the relevant steps of process 300, as described above, can be used to evaluate various battery cells, where the results of such evaluations can be collected and stored (e.g., remotely). The metrics for the various battery cells can be used to train a model to correlate metric values with expected lifespan, performance, or capacity of the measured cell. An additional database of electrochemical information can be used for this correlation. This electrochemical database can be populated with cycling data which is representative of the battery cells' performance and lifespan. The cycling data can reveal newly constructed cells that come off the production line. This information can be combined with the acoustic signal based metrics from the same battery cells and used to train models relating metrics, or combinations of metrics, to performance and lifespan. The reference model constructed in this manner can be used by a local system for collecting measurements on the production line. The reference model can then be applied to the metrics generated during production. The output of the reference model can provide an estimated performance or lifespan value for a test battery cell being measured, enabling the operator (or production sorting equipment) to bin the cell appropriately based on those values.

Figure 5:
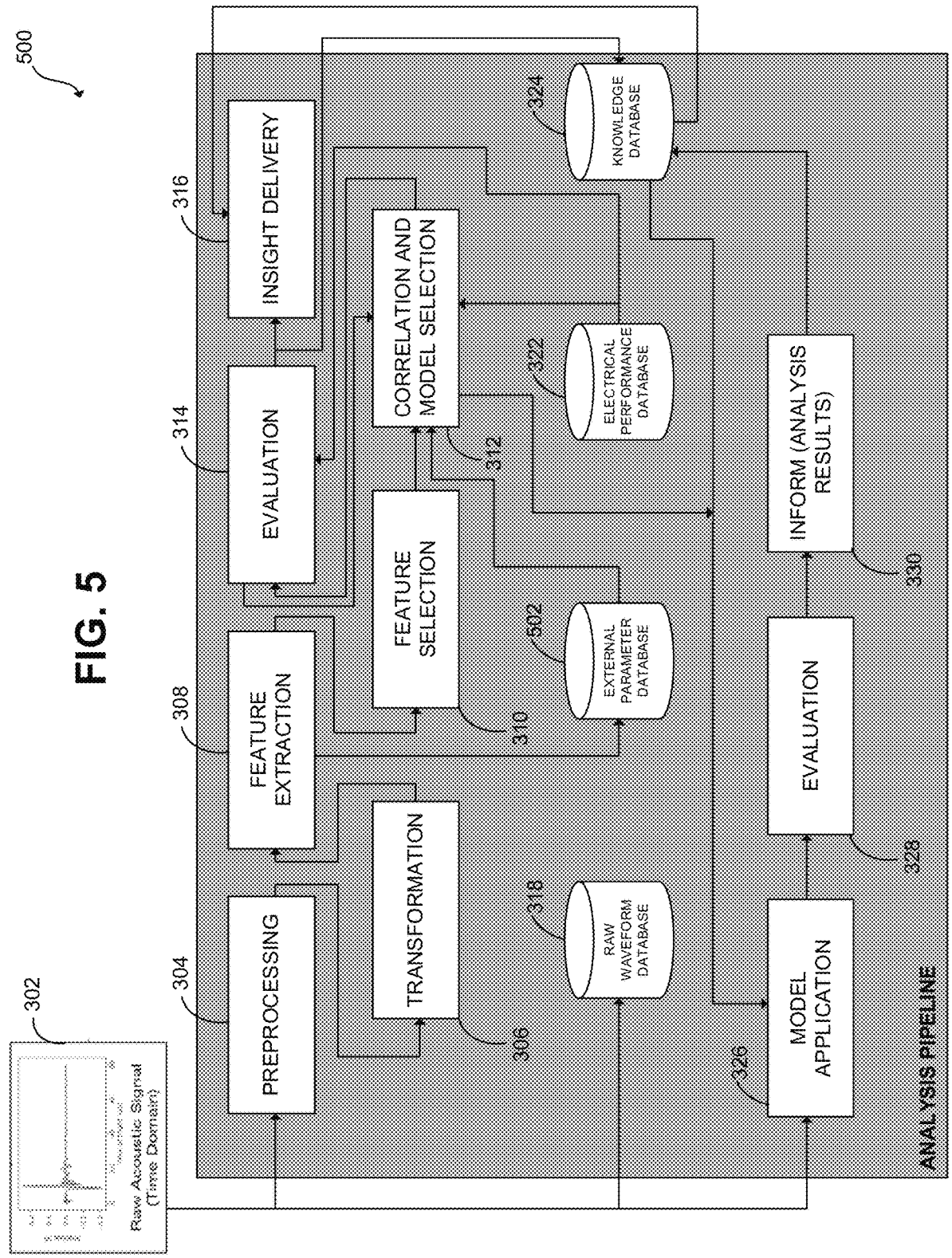
FIG. 5 illustrates another example process for obtaining and processing acoustic signal information, according to some aspects of the present disclosure.

FIG. 5 illustrates another example process for obtaining and processing acoustic signal information, according to some aspects of the present disclosure. For sake of brevity, steps of process 500 which are the same as that of process 300 of FIG. 3 are numbered the same and will not be further described. In comparison with process 300, process 500 includes an external parameter database 502 instead of feature database 320. In one example, external parameter database 320 can include information such as process parameters for other battery manufacturing processes (e.g., drying time for electrolyte wetting, speed of wetting, etc.). Furthermore, information in database 320 can also be provided as input into the correlation and model selection 312 block.

In a further comparison with process 300, results of evaluation at evaluation 314 block is provided as feedback to correlation and model selection 312 block for selecting appropriate one(s) of generated models to be used for analyzing collected raw data of a battery or battery cell(s) under testing.

In yet a further comparison with process 300, process 500 provides knowledge database 324 as an input into model application 326 for selecting a model for analyzing raw data 302 received from a battery or battery cell(s) under testing.

In a further comparison with process 300, output of inform (analysis results) 330 block is provided as an input into knowledge database 324 to be used in a continuous and iterative process of updating models and/or insight delivery for future analysis of acoustic signal information collected from a battery or battery cell(s) under testing.

In process 300 and 500, steps corresponding to processes 304, 306, 308 and 310 may collectively be referred to as a signal processing step and steps corresponding to processes 312 and 314 may collectively be referred to as a model generation step that, as described, can be implemented using iterative analysis and/or machine learning techniques.

Figure 6:
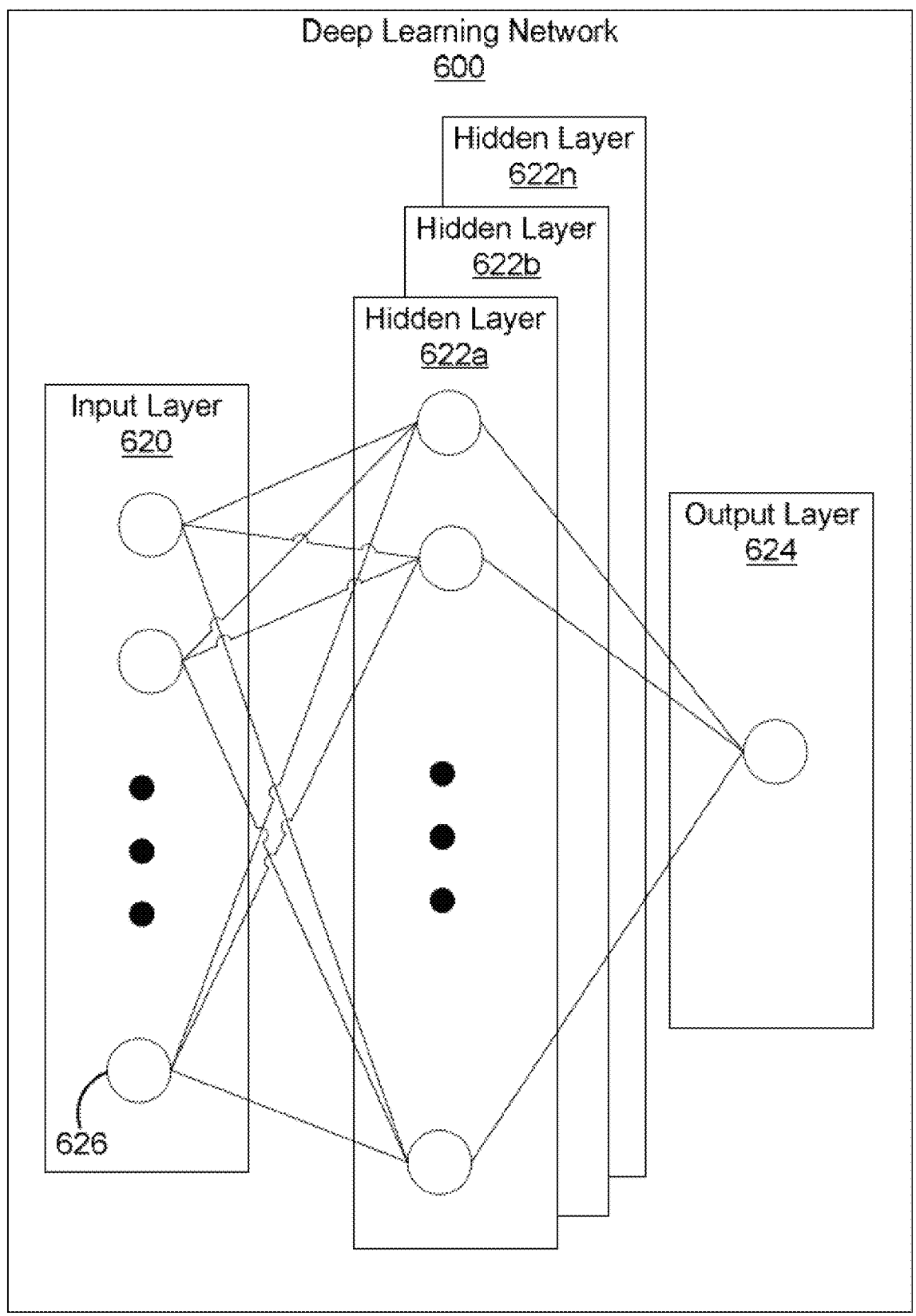
FIG. 6 is an illustrative example of a deep learning neural network that can be used by for model generation and/or analysis of raw data of a battery under testing, according to some aspects of the present disclosure.

FIG. 6 is an illustrative example of a deep learning neural network that can be used for model generation and/or analysis of raw data of a battery under testing, according to some aspects of the present disclosure. For example, the deep learning neural network can be utilized within process 300 and/or 500. An input layer 620 includes input data. In one illustrative example, the input layer 620 can include data representing the acoustic signal data after it has been subjected to preprocessing 304 and transformations 306 in FIG. 3. The deep learning neural network 600 includes multiple hidden layers 622a, 622b, through 622n. The hidden layers 622a, 622b, through 622n include "n" number of hidden layers, where "n" is an integer greater than or equal to one. The number of hidden layers can be made to include as many layers as needed for the given application. The deep learning neural network 600 further includes an output layer 624 that provides an output resulting from the processing performed by the hidden layers 622a, 622b, through 622n. In one illustrative example, the output layer 624 can provide a classification and/or a localization for certain acoustic signal features. The classification can include a class identifying the metrics (e.g., a centroid frequency) and the localization can include one or more centroid frequencies which can have a high correlation with the transformed acoustic signals.

The deep learning neural network 600 is a multi-layer neural network of interconnected nodes. Each node can represent a piece of information. Information associated with the nodes is shared among the different layers and each layer retains information as information is processed. In some cases, the deep learning neural network 600 can include a feed-forward network, in which case there are no feedback connections where outputs of the network are fed back into itself. In some cases, the deep learning neural network 600 can include a recurrent neural network, which can have loops that allow information to be carried across nodes while reading in input.

Information can be exchanged between nodes through node-to-node interconnections between the various layers. Nodes of the input layer 620 can activate a set of nodes in the first hidden layer 622a. For example, as shown, each of the input nodes of the input layer 620 is connected to each of the nodes of the first hidden layer 622a. The nodes of the hidden layer 622 can transform the information of each input node by applying activation functions to these information. The information derived from the transformation can then be passed to and can activate the nodes of the next hidden layer 622b by a non-linear activation function, which can perform their own designated functions. Example functions include convolutional, up-sampling, data transformation, and/or any other suitable functions. The output of the hidden layer 622b can then activate nodes of the next hidden layer, and so on. The output of the last hidden layer 622n can activate one or more nodes of the output layer 624, at which an output is provided. In some cases, while nodes (e.g., node 626) in the deep learning neural network 600 are shown as having multiple output lines, a node has a single output and all lines shown as being output from a node represent the same output value.

In some cases, each node or interconnection between nodes can have a weight that is a set of parameters derived from the training of the deep learning neural network 600. For example, an interconnection between nodes can represent a piece of information learned about the interconnected nodes. The interconnection can have a tunable numeric weight that can be tuned (e.g., based on a training dataset), allowing the deep learning neural network 600 to be adaptive to inputs and able to learn as more and more data is processed.

The deep learning neural network 600 is pre-trained to process the features from the data in the input layer 620 using the different hidden layers 622a, 622b, through 622n in order to provide the output through the output layer 624. In an example in which the deep learning neural network 600 is used to identify the features to be selected for set of transformed acoustic signal data (e.g., in the processes 308 and 310 of FIG. 3 and/or FIG. 5), the deep learning neural network 600 can be trained using training data that includes both acoustic data and non-acoustic data. For instance, training data can be input into the network from the features data base 309, with each feature having a label indicating the classes of the one or more features (basically, indicating to the network what the transformed acoustic signals are and what features they have).

In some cases, the deep learning neural network 600 can adjust the weights of the nodes using a training process called backpropagation. Backpropagation can include a forward pass, a loss function, a backward pass, and a weight update. The forward pass, loss function, backward pass, and parameter update is performed for one training iteration. The process can be repeated for a certain number of iterations for each set of training images until the network 600 is trained well enough so that the weights of the layers are accurately tuned.

For the example of identifying features which have a high correlation with performance, the forward pass can include passing a training set of metrics (e.g., centroid frequencies) through the deep learning neural network 600. Weights to be applied to this training set of metrics can be initially randomized before the deep learning neural network 600 is trained. For a first training iteration for the deep learning neural network 600, the output will likely include values that do not give preference to any particular class due to the weights being randomly selected at initialization. For example, if the output is a set of centroid with probabilities that the transformed acoustic data includes different values of the centroid frequencies, the probability value for each of the different centroid frequencies may be equal or at least very similar (e.g., for ten possible classes, each class may have a probability value of 0.1). With the initial weights, the deep learning neural network 600 is unable to determine low level features and thus cannot make an accurate determination of what the classification might be. A loss function can be used to analyze error in the output. Any suitable loss function definition can be used. One example of a loss function includes a mean squared error (MSE). The loss (or error) will be high for the first training set since the actual values will be much different than the predicted output. The goal of training is to minimize the amount of loss so that the predicted output is the same as the training label. The deep learning neural network 600 can perform a backward pass by determining which inputs (weights) most contributed to the loss of the network, and can adjust the weights so that the loss decreases and is eventually minimized.

A derivative of the loss with respect to the weights can be computed to determine the weights that contributed most to the loss of the network. After the derivative is computed, a weight update can be performed by updating all the weights of the filters. The deep learning network 600 can include any suitable deep network. One example includes a convolutional neural network (CNN), which includes an input layer and an output layer, with multiple hidden layers between the input and out layers. The hidden layers of a CNN include a series of convolutional, nonlinear, pooling (for downsampling), and fully connected layers. The deep learning neural network 600 can include any other deep network element other than a CNN, such as a multi-layer perceptron (MLP), Recurrent Neural Networks (RNNs), among others.

Figure 7:
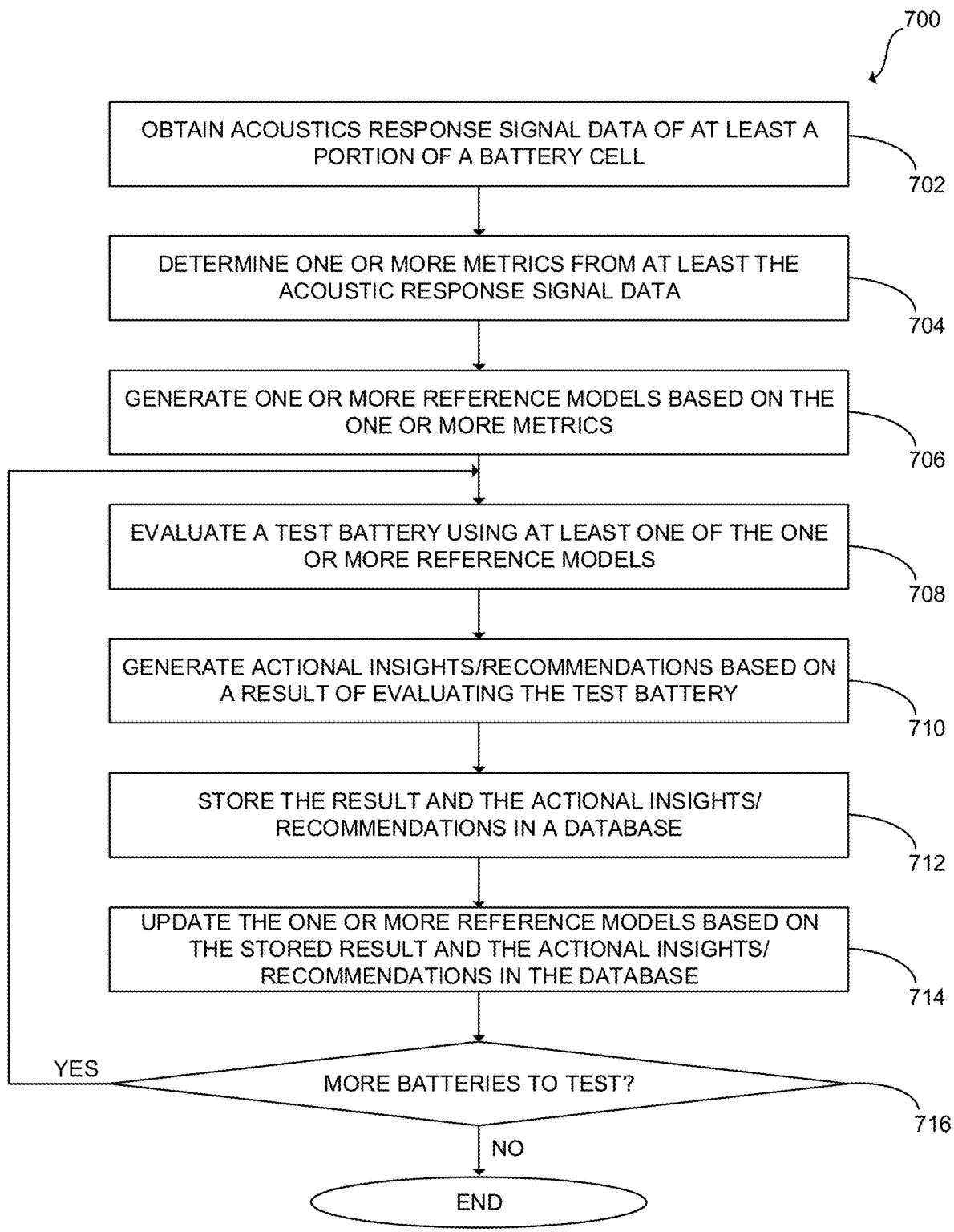
FIG. 7 illustrates a process for automatically generating one or more reference models for use in acoustic analysis of one or more battery cells according to some aspects of the present disclosure.

Accordingly, it will be appreciated that example aspects include various methods for performing the processes, functions and/or algorithms disclosed herein. FIG. 7 illustrates a process for automatically generating one or more reference models for use in acoustic analysis of one or more battery cells according to some aspects of the present disclosure. In one example, steps of process 700 of FIG. 7 may be implemented by any one of processor 110, processor 130 and/or processor 150 of FIGS. 1A-C.

In more detail, the step 702 of the process 700 includes obtaining acoustic response signal data of at least a portion of a battery cell and/or component(s) thereof (e.g., raw data 302), the acoustic response signal data including waveforms generated by transmitting one or more acoustic excitation signals into at least the portion of the battery cell and recording response vibration signals to the one or more acoustic excitation signals. For example, acoustic signal data including waveforms (e.g., the Rx signal 162) can be obtained from one or more Tx transducers 104 and one or more Rx transducers 106 on battery cell 102. In some examples, the sensors 206 may be used to collect the response signals at the two or more locations on at least one surface of the battery cell 202.

The step 704 includes determining one or more metrics from at least the acoustic response signal data, the one or more metrics being determined based on a machine learning model for analyzing correlation of the one or more metrics to one or more characteristics of battery cells. For example, signal processing steps including a combination of one or more of preprocessing 304, transformations 306, feature extraction 308, and feature selection 310 blocks of process 300 in FIG. 3 and/or process 500 in FIG. 5 can be used to determine a reduced set of metrics. In some examples, the deep learning network 600 of FIG. 6 or other machine learning engine or technique can be used in determining the one or more metrics.

The step 706 includes generating one or more reference models from the one or more metrics. For example, the process 400 implemented by the processes of correlation and model selection 312 block and evaluation 314 block can be used to determine the one or more reference models comprising the metrics which display the highest correlation with the performance metrics of interest.

In one example, machine learning techniques described herein can be utilized to develop the one or more reference models. Such machine-learning based model can then be deployed at steps 708 and 710 described below to evaluate a battery cell or components thereof under testing to identify one or more characteristics of the battery and provide actionable insights. Furthermore, identified one or more characteristics and/or actionable insights can be used as feedback by the machine learning technique to iteratively and continuously update the one or more reference models. Moreover, raw data obtained at step 302 may simultaneously be used to both determine characteristics of the battery under testing and to update/modify the one or more reference models through iterative performance of steps 704 and 706.

The step 708 includes evaluating a test battery using at least one of the one or more reference models generated at step 706. For example, the model application 326 and evaluation 328 blocks of FIG. 3 and/or model application 326 and evaluation 328 blocks of FIG. 5 can apply the model (e.g., machine learning based model) generated by the processes at correlation and model selection 312 block and evaluation 314 block to evaluate acoustic signal information (e.g., the raw data 302 obtained at step derived from a test battery.

The step 710 includes generating actionable information and/or recommendations. For example, the results of the evaluation can reveal whether the test battery is sufficiently wetted, based on which, the inform 330 can include a recommendation to prolong or reduce the wetting time of the test battery. Another example insight can include an expected lifecycle of the test battery. Any other known or to be developed insight indicative of quality of manufacturing, performance and lifecycle of the test battery, including those described above, can be included in the result of evaluation with corresponding actionable insights being provided at information 330 block to a system operator. Such recommendation may be displayed on a terminal connected to a system under which a battery is tested (e.g., a terminal connected to processor 110).

At step 712 the results of evaluation and/or corresponding actionable insights and recommendations can be stored in knowledge database 324 for further iterative refining and updating of reference models.

At step 714, the reference model is updated using the newly stored evaluation and/or corresponding actionable insights and recommendations stored in knowledge database 324.

At step 716, a determination is made as to whether another battery is under testing. If not, step 716 is periodically repeated to check for a new battery to be tested (e.g., placed within systems 100, 120 and/or 140). Systems 100, 120 and/or 140 may have one or more sensors for detecting placement or presence of new/additional batteries to be tested.

Once a new battery is detected, the process of FIG. 7 reverts back to the step 708 and the steps 708, 710, 712, 714 and/or 716 are periodically repeated until there is no more battery to be tested.

With various examples of systems and techniques described above for generating analysis models and/or analyzing characteristics of test batteries using such models, with reference to FIGS. 1-7, the disclosure now turns to example computing system that can be utilized to implement various system components for implementing the analysis including processors 110, 130 and 150 of FIGS. 1A, 1B and 1C, respectively and/or any other computer/system component needed for generating, sending and receiving acoustic signals, generating models and analyzing batteries using such models.

Figure 8:
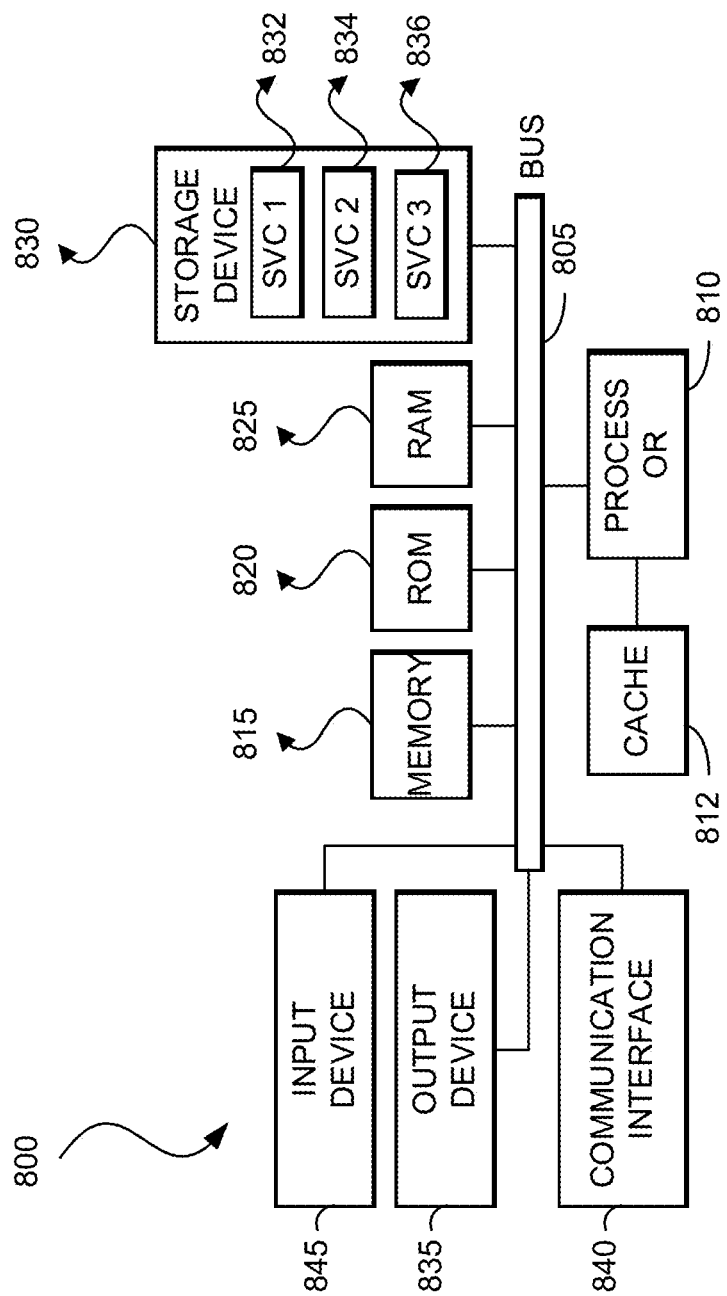
FIG. 8 illustrates an example computing system, according to one aspect of the present disclosure.

FIG. 8 illustrates an example computing system, according to one aspect of the present disclosure. FIG. 8 shows an example of computing system 800 with various components of it connected via connection 805. Connection 805 can be a physical connection via a bus, or a direct connection into processor 810, such as in a chipset architecture. Connection 805 can also be a virtual connection, networked connection, or logical connection.

In some embodiments computing system 800 is a distributed system in which the functions described in this disclosure can be distributed within a datacenter, multiple datacenters, a peer network, etc. In some embodiments, one or more of the described system components represents many such components each performing some or all of the function for which the component is described. In some embodiments, the components can be physical or virtual devices.

Example computing system 800 includes at least one processing unit (CPU or processor) 810 and connection 805 that couples various system components including system memory 815, such as read only memory (ROM) 820 and random access memory (RAM) 825 to processor 810. Computing system 800 can include a cache of high-speed memory 812 connected directly with, in close proximity to, or integrated as part of processor 810.

Processor 810 can include any general purpose processor and a hardware service or software service, such as services 832, 834, and 836 stored in storage device 830, configured to control processor 810 as well as a special-purpose processor where software instructions are incorporated into the actual processor design. Processor 810 may essentially be a completely self-contained computing system, containing multiple cores or processors, a bus, memory controller, cache, etc. A multi-core processor may be symmetric or asymmetric.

To enable user interaction, computing system 800 includes an input device 845, which can represent any number of input mechanisms, such as a microphone for speech, a touch-sensitive screen for gesture or graphical input, keyboard, mouse, motion input, speech, etc. Computing system 800 can also include output device 835, which can be one or more of a number of output mechanisms known to those of skill in the art. In some instances, multimodal systems can enable a user to provide multiple types of input/output to communicate with computing system 800. Computing system 800 can include communications interface 840, which can generally govern and manage the user input and system output. There is no restriction on operating on any particular hardware arrangement and therefore the basic features here may easily be substituted for improved hardware or firmware arrangements as they are developed.

Storage device 830 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read only memory (ROM), and/or some combination of these devices.

The storage device 830 can include software services, servers, services, etc., that when the code that defines such software is executed by the processor 810, it causes the system to perform a function. In some embodiments, a hardware service that performs a particular function can include the software component stored in a computer-readable medium in connection with the necessary hardware components, such as processor 810, connection 805, output device 835, etc., to carry out the function.

For clarity of explanation, in some instances the various embodiments may be presented as including individual functional blocks including functional blocks comprising devices, device components, steps or routines in a method embodied in software, or combinations of hardware and software.

Claim language reciting "at least one of" refers to at least one of a set and indicates that one member of the set or multiple members of the set satisfy the claim. For example, claim language reciting "at least one of A and B" means A, B, or A and B.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Accordingly, an aspect of the present disclosure can include a computer-readable media embodying a method of electrochemical-acoustic signal interrogation (EASI) of one or more battery cells. Accordingly, the present disclosure is not limited to illustrated examples and any means for performing the functionality described herein are included in the present disclosure.

While the foregoing disclosure shows illustrative aspects of the present disclosure, it should be noted that various changes and modifications could be made herein without departing from the scope of inventive concepts described herein. The functions, steps and/or actions of the method claims in accordance with the aspects of the present disclosure described herein need not be performed in any particular order. Furthermore, although elements of the present disclosure may be described or claimed in the singular, the plural is contemplated unless limitation to the singular is explicitly stated.

What is claimed is:

1. A method of acoustic signal-based analysis, the method comprising:

receiving raw acoustic data associated with a battery under testing;

selecting one or more features indicative of performance of the battery based on the raw acoustic data;

selecting at least one reference model, from among a plurality of reference models, that is correlated to the one or more features, each of the plurality of reference models being an acoustic-based model generated using previously collected acoustic data and non-acoustic data for a plurality of batteries and trained for determining a different set of characteristics of batteries subject to acoustic testing;

applying the at least one reference model to the one or more features to determine one or more characteristics of the battery, wherein the at least one reference model receives the one or more features as an input and provides the one or more characteristics as an output; and generating one or more actionable insights for the battery using the one or more characteristics.

2. The method of claim 1, further comprising:

determining at least one stage of a battery manufacturing process during which the raw acoustic data are collected; and selecting the at least one reference model based at least in part on the at least one stage of the battery manufacturing process during which the raw acoustic data are collected.

3. The method of claim 1, wherein the one or more characteristics include one or more performance characteristics, state of charge, state of health, construction quality, and expected lifecycle of the battery.

4. The method of claim 1, wherein selecting the one or more features comprises:

processing the raw acoustic data to yield processed data;
extracting a plurality of features from the processed data; and
selecting the one or more features from the plurality of features.

5. The method of claim 4, wherein processing the raw acoustic data comprises:

preprocessing the raw acoustic data to yield preprocessed data; and
transforming the preprocessed data to yield the processed data.

6. The method of claim 1, further comprising:

updating the at least one reference model using the one or more characteristics and the one or more actionable insights.

7. The method of claim 1, wherein the one or more features include one or more of electrolyte distribution through the battery, foreign object inclusions, electrode porosity, electrode density distribution, lithium plating after charging a battery cell, solid-electrolyte interphase layer quality, process drifts, ideal soaking time, protocol variations, voltage, resistance, impedance, capacity, and cell capacity fade over lifetime.

8. The method of claim 1, wherein receiving the raw acoustic data comprises:

sending acoustic signals through the battery; and
receiving acoustic response signals in response to the acoustic signals, the acoustic response signals being the raw acoustic data.

9. An apparatus comprising:

one or more memories having computer-readable instructions stored therein; and
one or more processors configured to execute the computer-readable instructions to:
receive raw acoustic data associated with a battery under testing;
select one or more features indicative of performance of the battery based on the raw acoustic data;
select at least one reference model, from among a plurality of reference models, that is correlated to the one or more features, each of the plurality of reference models being an acoustic-based model generated using previously collected acoustic data and non-acoustic data for a plurality of batteries and trained for determining a different set of characteristics of batteries subject to acoustic testing;
apply the at least one reference model to the one or more features to determine one or more characteristics of the battery, wherein the at least one reference model receives the one or more features as an input and provides the one or more characteristics as an output; and
generate one or more actionable insights for the battery using the one or more characteristics.

10. The apparatus of claim 9, wherein the one or more processors are further configured to execute the computer-readable instructions to:

determine at least one stage of a battery manufacturing process during which the raw acoustic data are collected; and
select the at least one reference model based at least in part on the at least one stage of the battery manufacturing process during which the raw acoustic data are collected.

11. The apparatus of claim 9, wherein the one or more characteristics include one or more performance characteristics, state of charge, state of health, construction quality, and expected lifecycle of the battery.

12. The apparatus of claim 9, wherein the one or more processors are further configured to execute the computer-readable instructions to select the one or more features by:

processing the raw acoustic data to yield processed data;
extracting a plurality of features from the processed data; and
selecting the one or more features from the plurality of features.

13. The apparatus of claim 12, wherein the one or more processors are further configured to execute the computer-readable instructions to process the raw acoustic data by:

preprocessing the raw acoustic data to yield preprocessed data; and
transforming the preprocessed data to yield the processed data.

14. The apparatus of claim 9, wherein the one or more processors are further configured to execute the computer-readable instructions to:

update the at least one reference model using the one or more characteristics and the one or more actionable insights.

15. The apparatus of claim 9, wherein the one or more features include one or more of electrolyte distribution through the battery, foreign object inclusions, electrode porosity, electrode density distribution, lithium plating after charging a battery cell, solid-electrolyte interphase layer quality, process drifts, ideal soaking time, protocol variations, voltage, resistance, impedance, capacity, and cell capacity fade over lifetime.

16. The apparatus of claim 9, further comprising:

one or more transducers configured to:
send acoustic signals through the battery; and
receive acoustic response signals in response to the acoustic signals, the acoustic response signals being the raw acoustic data received by the one or more processors.

17. One or more non-transitory computer-readable media comprising computer-readable instructions, which when executed by one or more processors of a battery testing apparatus, cause the battery testing apparatus to:

receive raw acoustic data associated with a battery under testing;
select one or more features indicative of performance of the battery based on the raw acoustic data;
select at least one reference model, from among a plurality of reference models, that is correlated to the one or more features, each of the plurality of reference models being an acoustic-based model generated using previously collected acoustic data and non-acoustic data for a plurality of batteries and trained for determining a different set of characteristics of batteries subject to acoustic testing;

apply the at least one reference model to the one or more features to determine one or more characteristics of the battery, wherein the at least one reference model receives the one or more features as an input and provides the one or more characteristics as an output; and generate one or more actionable insights for the battery using the one or more characteristics.

18. The one or more non-transitory computer-readable media of claim 17, wherein execution of the computer-readable instructions by the one or more processors further cause the battery testing apparatus to select the one or more features by:

processing the raw acoustic data to yield processed data;
extracting a plurality of features from the processed data; and
selecting the one or more features from the plurality of features.

19. The one or more non-transitory computer-readable media of claim 18, wherein execution of the computer-readable instructions by the one or more processors further cause the battery testing apparatus to process the raw acoustic data by:

preprocessing the raw acoustic data to yield preprocessed data; and
transforming the preprocessed data to yield the processed data.

20. The one or more non-transitory computer-readable media of claim 17, wherein the battery testing apparatus includes one or more transducers configured to:

send acoustic signals through the battery; and
receive acoustic response signals in response to the acoustic signals, the acoustic response signals being the raw acoustic data received by the one or more processors.

* * * * *